United States Patent
Sakamoto et al.

(10) Patent No.: US 7,751,194 B2
(45) Date of Patent: Jul. 6, 2010

(54) CIRCUIT DEVICE, CIRCUIT MODULE, AND OUTDOOR UNIT

(75) Inventors: Hideyuki Sakamoto, Gunma (JP); Hidefumi Saito, Gunma (JP); Yasuhiro Koike, Gunma (JP); Masao Tsukizawa, Gunma (JP)

(73) Assignees: Sanyo Electric Co., Ltd., Moriguchi-shi (JP); Sanyo Semiconductor Co. Ltd., Gunma (JP)

( * ) Notice: Subject to any disclaimer, the term of this patent is extended or adjusted under 35 U.S.C. 154(b) by 0 days.

(21) Appl. No.: 12/239,286

(22) Filed: Sep. 26, 2008

(65) Prior Publication Data

US 2009/0086431 A1    Apr. 2, 2009

(30) Foreign Application Priority Data

Sep. 27, 2007  (JP) .............................. 2007-250484
Sep. 27, 2007  (JP) .............................. 2007-252202
Oct. 31, 2007  (JP) .............................. 2007-284349

(51) Int. Cl.
*H05K 7/20* (2006.01)
*H01L 23/28* (2006.01)

(52) U.S. Cl. ...................... 361/719; 361/690; 361/692; 361/704; 165/185; 174/16.1; 174/522; 174/547; 363/141

(58) Field of Classification Search ................. 361/690, 361/694–695, 697, 704, 715, 720–721; 165/80.2–80.3; 174/16.1, 16.3, 521–522, 547–548; 363/141
See application file for complete search history.

(56) References Cited

U.S. PATENT DOCUMENTS 4,901,203 A *  2/1990  Kobayashi et al. .......... 361/737
5,105,322 A    4/1992  Steltzer
5,408,383 A *  4/1995  Nagasaka et al. ............ 361/707
5,444,297 A    8/1995  Oshima et al.

(Continued)

FOREIGN PATENT DOCUMENTS

JP          10229288 A  *  8/1998

(Continued)

OTHER PUBLICATIONS

Sakamoto et al., U.S. Office Action mailed Dec. 16, 2009, directed to U.S. Appl. No. 12/239,250; 8 pages.

(Continued)

*Primary Examiner*—Jayprakash N Gandhi
*Assistant Examiner*—Robert J Hoffberg
(74) *Attorney, Agent, or Firm*—Morrison & Foerster LLP

(57) ABSTRACT

Provided is a circuit device capable of increasing the packaging density and also suppressing the thermal interference between incorporated circuit elements. In a hybrid integrated circuit device, a first circuit board and a second circuit board are incorporated into a case member being arranged in a way that the first circuit board is overlaid with the second circuit board. A first circuit element is arranged on the upper face of the first circuit board and a second circuit element is arranged on the upper face of the second circuit board. In addition, inside the case member, a hollow portion (internal space) which is not filled with a sealing resin is provided, and this hollow portion communicates with the outside through a communicating opening, which is provided by partially opening the case member.

9 Claims, 15 Drawing Sheets

U.S. PATENT DOCUMENTS

| | | | |
|---|---|---|---|
| 5,519,252 A * | 5/1996 | Soyano et al. | 257/690 |
| 5,586,388 A * | 12/1996 | Hirao et al. | 29/830 |
| 5,610,799 A | 3/1997 | Kato | |
| 5,646,827 A * | 7/1997 | Hirao et al. | 361/707 |
| 5,657,203 A * | 8/1997 | Hirao et al. | 361/707 |
| 5,694,294 A * | 12/1997 | Ohashi et al. | 361/679.48 |
| 5,751,058 A * | 5/1998 | Matsuki | 257/692 |
| 5,777,846 A * | 7/1998 | Hayes et al. | 361/690 |
| 6,072,122 A | 6/2000 | Hosoya | |
| 6,144,571 A | 11/2000 | Sasaki et al. | |
| 6,147,869 A | 11/2000 | Furnival | |
| 6,304,448 B1 * | 10/2001 | Fukada et al. | 361/700 |
| 6,583,355 B2 * | 6/2003 | Skrzypchak | 174/521 |
| 6,690,582 B2 | 2/2004 | Sumida | |
| 6,717,812 B1 * | 4/2004 | Pinjala et al. | 361/699 |
| 6,958,535 B2 | 10/2005 | Hirano et al. | |
| 7,375,287 B2 * | 5/2008 | Rathmann | 174/260 |
| 7,589,978 B1 * | 9/2009 | Holdredge et al. | 361/818 |
| 7,623,347 B2 * | 11/2009 | Matsui | 361/695 |
| 2008/0204998 A1 * | 8/2008 | Matsui | 361/695 |
| 2009/0086442 A1 | 4/2009 | Sakamoto et al. | |
| 2009/0086454 A1 | 4/2009 | Sakamoto et al. | |
| 2009/0086455 A1 | 4/2009 | Sakamoto et al. | |
| 2009/0103276 A1 | 4/2009 | Sakamoto et al. | |

FOREIGN PATENT DOCUMENTS

| | | |
|---|---|---|
| JP | 2000-228491 | 8/2000 |
| JP | 2007-36014 | 2/2007 |

OTHER PUBLICATIONS

Sakamoto et al., U.S. Office Action mailed Mar. 30, 2010, directed to related U.S. Appl. No. 12/239,256; 6 pages.

* cited by examiner

Prior Art

CIRCUIT DEVICE, CIRCUIT MODULE, AND OUTDOOR UNIT

This application claims priority from Japanese Patent Application Number JP 2007-252202, filed on Sep. 27, 2007, JP 2007-250484 filed on Sep. 27, 2007, and JP 2007-284349 filed on Oct. 31, 2007, the content of which is incorporated herein by reference in its entirety.

BACKGROUND OF THE INVENTION

1. Field of the Invention

The present invention relates to a circuit device, a circuit module, and an outdoor unit, and in particular, relates to a circuit device, a circuit module, and an outdoor unit in which a hybrid integrated circuit formed on an upper face of a circuit board is sealed with a case member.

2. Description of the Related Art

In recent years, newspapers report environmental destruction, signs of global warming, and the causes of the warming. One of various causes for the warming is an increase in electricity consumption. The generation of electricity depends largely on the exhausting oil, and the burning of the oil causes the problem of the emission of the carbon dioxide gas into the atmosphere. Another cause of the warming is automobiles, most of which use gasoline for fuel.

The electricity is absolutely necessary for operating the electronic equipments existing all over the world. The electricity serves as the power source for the electronic equipments such as a washing machine, an air conditioner, and a mobile device, and is indispensable for human beings living on the earth to maintain a cultural life, and thus the increase in electricity consumption is an issue difficult to solve.

Meanwhile, automobiles have been more sophisticated in functionality, by achieving, for example, the teleconference made therein, the guidance to a destination by a car navigation system, cooling by a car air conditioner, and clearly and brightly illuminating by headlights. The consumers all over the world have been competing in purchasing such automobiles. Unlike in the old days, driving the automobile while using various functions in the vehicle interior results in an increase in energy consumption eventually.

The same is true of computers and mobile phones. In order to achieve these functions, semiconductor devices, the so-called power element, IC and LSI, are employed, and these components are mounted on a substrate, such as a printed circuit board for example. The substrate is then mounted on a set of electronic equipments. Considering this aspect, a reduction in electricity consumption is a very important subject also for the semiconductor devices.

Such electronic equipments, particularly, the semiconductor devices generate heat during its own operation. As the temperature of an active region increases, the driving capability decreases. More energy has been consumed with the increase of the driving capability.

Accordingly, the electricity consumed by a semiconductor device itself needs to be reduced by releasing the heat of the semiconductor device to the outside in a certain way. A power MOS device capable of power driving is an example of the devices that are most likely to exhibit the tendency of the increased temperature, and needs to release the heat with an innovative way. For the purpose of releasing the heat, in the devices, such as an inverter module used in a washing machine, a refrigerator, and the like, and in a driver module used in a plasma display, a metal substrate has been frequently mounted recently.

The surface of the metal substrate is covered with an insulating resin or the like, a conductive pattern is formed thereon, and the elements required for the inverter circuit for example, are electrically connected to, and mounted on the conductive pattern.

The configuration of a hybrid integrated circuit device 150 employing a case member 111 is described with reference to FIG. 15. The hybrid integrated circuit device 150 includes: a substrate 101 made of a metal, such as aluminum; an insulating layer 102 formed so as to cover the upper face of the substrate 101; a conductive pattern 103 formed on the upper face of the insulating layer 102; and a circuit element 110 such as a transistor electrically connected to the conductive pattern 103. Then, the circuit element 110 is sealed with the case member 11 and a sealing resin 108.

Specifically, the case member 111 has an approximately frame-like shape and is in contact with the side face of the substrate 101. In addition, in order to secure a sealing space over the upper face of the substrate 101, the upper end part of the case member 111 is positioned above the upper face of the substrate 101. Then, the sealing resin 108 is filled in the space surrounded by the case member 111 above the substrate 101 so as to cover the circuit element 110 such as a semiconductor element. With this configuration, the circuit element incorporated on the upper face of the substrate 101 can be sealed with a sealing resin 108 being filling in the space surrounded by the case member 111, even if the substrate 101 is relatively large.

This technology is described for instance in Japanese Patent Application Publication No. 2007-036014.

In the hybrid integrated circuit device 150 described above, a power transistor, such as an insulated gate bipolar transistor (IGBT), and a driver IC for driving this power transistor are mounted on the upper face of the substrate 101. In addition, a controlling element, such as a microcomputer for controlling this driver IC, is mounted on the mounting substrate side on which the hybrid integrated circuit device 150 is mounted. Because of this configuration, the area required to mount a circuit which controls for driving a load, such as a motor, has to be large on the mounting substrate side.

In order to solve the above-described problem, provided is a method in which the microcomputer is fixed, for example, to the upper face of the substrate 101 together with the above-described power transistor or driver IC. This configuration allows the power transistor and the microcomputer to be incorporated into one hybrid integrated circuit device, thereby requires smaller area for mounting the control circuit. However, if the power transistor and the microcomputer are fixed to the upper face of the same substrate 101, a heat generated in the power transistor is conducted to the microcomputer via the substrate 101 made of a metal such as aluminum. In addition, the heat generated in the power transistor is conducted to the microcomputer via the sealing resin 108 for sealing the entire device. As a result, the microcomputer heated by the power transistor might cause a misoperation.

Additionally, the operation of an air conditioner is controlled by a circuit module attached to the outdoor unit thereof. Since being installed in the outside, the outdoor unit is exposed to a considerably high temperature. Accordingly, this condition causes a crack or the like in the electrically connected portion of the circuit module, and therefore, a countermeasure for releasing, to the outside, the heat generated in the circuit module is required.

SUMMARY OF THE INVENTION

The present invention has been made in view of the problems described above. A main object of the present invention is thus to provide a circuit device, a circuit module, and an outdoor unit capable of increasing the packaging density and suppressing the thermal interference between circuit elements to be incorporated therein.

According to a first aspect of the invention, a circuit device comprises: a case member; a first circuit board and a second circuit board incorporated into the case member and arranged in a way that the first circuit board is overlaid with the second circuit board; a first circuit element fixedly secured to a principal face of the first circuit board; and a second circuit element fixedly secured to a principal face of the second circuit board, wherein a communicating opening for allowing an internal space of the case member to communicate with an outside is provided in the case member.

In addition, according to a second aspect of the invention, a circuit device comprises: a case member; a first circuit board and a second circuit board incorporated into the case member and arranged in a way that the first circuit board is overlaid with the second circuit board; a first circuit element, which is a power transistor, fixedly secured to a principal face of the first circuit board; a second circuit element which is fixedly secured to a principal face of the second circuit board and controls an operation of the first circuit element; a first sealing resin for sealing the first circuit element in the case member, the first circuit element being fixedly secured to the first circuit board; and a second sealing resin for sealing the second circuit element which is fixedly secured to the second circuit board, wherein a communicating opening for allowing an internal space of the case member to communicate with an outside is provided in the case member.

The present invention has been made in view of the above-described problems, and firstly, these problems are solved by a circuit module, comprising: a case member formed of a pair of first side walls facing each other and a pair of second side walls united with the pair of first side walls, the case member having an upper opening and a lower opening; a first module substrate which is fitted into the lower opening and on which a circuit element is mounted; a second module substrate which is supported by a step portion provided on an inner wall of the case member and on which a circuit element is mounted; and a cutout portion provided on a side wall of the case member above the second module substrate, wherein the first module substrate is vertically installed, the cutout portion is provided in each of a side wall positioned on the lower side and a side wall positioned on the upper side, and a heat inside the circuit module is released to the outside from the cutout portion positioned on the upper side with an air flow path entering from the lower cutout portion.

Additionally, the above-described problems are solved by an outdoor unit comprising at least: a chassis; a fan secured to the chassis; a compressor installed inside the chassis; a frame provided in the chassis; and a circuit module provided to the frame, wherein the circuit module includes: a case member formed of a pair of first side walls facing each other and a pair of second side walls united with the pair of first side walls, the case member having an upper opening and a lower opening; a first module substrate which is fitted into the lower opening and on which a circuit element is mounted; a second module substrate which is supported by a step portion provided in an inner wall of the case member and on which a circuit element is mounted; and a cutout portion provided in a side wall of the case member above the second module substrate, wherein, the first module substrate is vertically installed in the circuit modules, the cutout portion is provided in each of a side wall positioned on the lower side and a side wall positioned on the upper side in the circuit modules, and a heat inside the circuit module is released to the outside from the cutout portion positioned on the upper side with an air flow path entering from the lower cutout portion.

BRIEF DESCRIPTION OF THE DRAWINGS

FIG. 1A is a perspective view and FIG. 1B is a cross sectional view.

FIG. 2A is a cross sectional view and FIG. 2B is an enlarged cross sectional view.

FIG. 3A and FIG. 3B are cross sectional views.

FIG. 6A is a perspective view and FIG. 6B is a cross sectional view.

FIG. 8A is a cross sectional view and FIG. 8B is a plan view.

FIG. 14A is a cross sectional view and FIG. 14B is a plan view.

DESCRIPTION OF THE INVENTIONS

First Embodiment

Figure 1A:
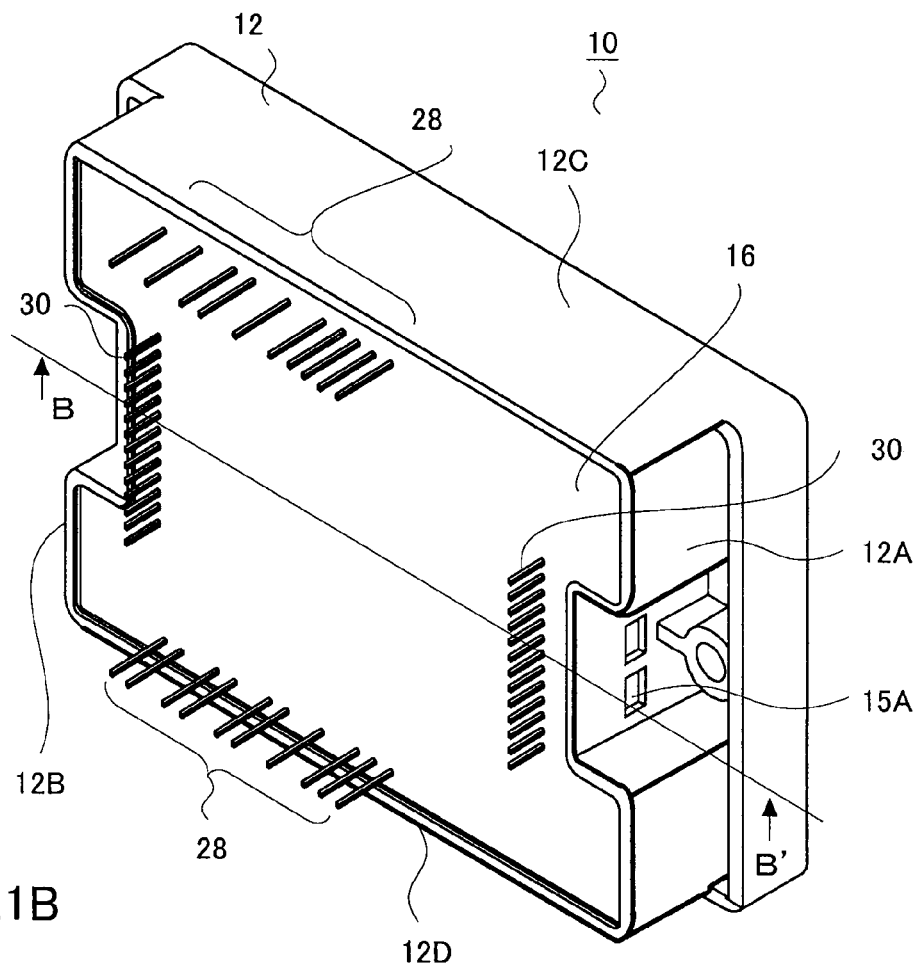
FIG. 1A and FIG. 1B are views showing a hybrid integrated circuit device which is an embodiment of a circuit device of the present invention.

As an example of the circuit device, the configuration of a hybrid integrated circuit device 10 is described with reference to FIGS. 1A and 1B. FIG. 1A is a perspective view of the hybrid integrated circuit device 10, and FIG. 1B is a cross sectional view of FIG. 1A taken along a B-B' line.

Figure 1B:
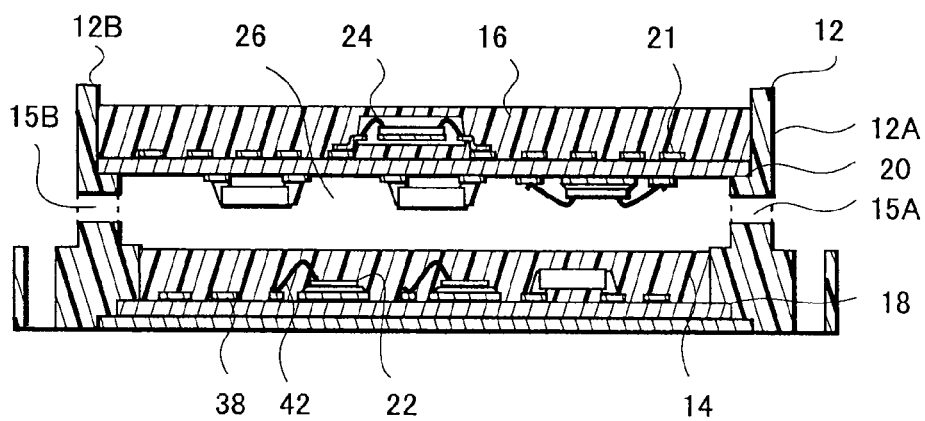

As shown in FIG. 1A and FIG. 1B, in the hybrid integrated circuit device 10, a first circuit board 18 is overlaid with a second circuit board 20 and both circuit boards are incorporated into a case member 12. A first circuit element 22 (a power transistor, for example) is arranged on the upper face of the first circuit board 18, and a second circuit element 24 (a microcomputer, for example) is arranged on the upper face of the second circuit board 20. In addition, inside the case member 12, a hollow portion 26 (internal space) which is not filled with a sealing resin is provided, and this hollow portion 26 and the outside communicate with each other through communicating openings 15A, 15B which are provided by partially opening the case member 12.

The case member 12 is formed by injection molding a thermosetting resin, such as an epoxy resin, or a thermoplastic resin, such as an acrylic resin, and exhibits an approximately frame-like shape. As shown in FIG. 1B, the upper face and the lower face of the case member 12 form openings, and the opening in the upper face is covered with the second circuit board 20, and the opening in the lower face is covered with the first circuit board 18. In addition, screw holes for fastening screws are provided at the left and right end portions of the case member 12, respectively.

In addition, in this embodiment, the communicating opening 15A for allowing the internal space of the case member 12 and the outside to communicate with each other is provided in the side wall part of the case member 12. Specifically, as shown in FIG. 1A, the case member 12 is consisted of a first side wall part 12A, a second side wall part 12B, a third side wall part 12C, and a fourth side wall part 12D. As shown in FIG. 1B, the communicating opening 15A is provided by partially opening the first side wall part 12A on the right side of the figure while the communicating opening 15B is provided in a similar manner also on the second side wall part 12B facing to the first side wall part 12A. Here, for example, one communicating opening 15A may be provided in the first side wall part 12A, or a plurality of communicating openings may be provided discretely.

In addition, the communicating opening having the above-described configuration may be provided only in one side wall part of the case member 12, or may be provided in three or four side wall parts.

The first circuit board 18 is incorporated into the lower opening of the case member 12, and is made of either aluminum (Al), copper (Cu), or an alloy containing at least one of these metals as a primary material. Here, two metal substrates made of aluminum are employed as the first circuit board 18. However, the first circuit board 18 may be made of one metal substrate. The detail of the first circuit board 18 will be described with reference to FIG. 2B.

The second circuit board 20 is incorporated into the opening on the upper side of the case member 12, and here a printed circuit board (PCB) is employed. Specifically, a paper phenol substrate, a glass epoxy substrate, or the like is employed as the second circuit board 20. Alternatively, a substrate made of ceramic may be employed as the second circuit board 20. In addition, a conductive pattern 21 may be formed only on the upper face of the second circuit board 20, or the conductive pattern 21 may be provided on the both sides thereof. In addition, the conductive pattern 21 stacked in three or more layers may be formed on the second circuit board 20.

As a second circuit element 24 mounted on the second circuit board 20, a microcomputer or the like having a smaller amount of heat generation than the first circuit element 22 mounted on the first circuit board 18 is mounted. Accordingly, as the second circuit board 20, a printed circuit board which is less thermally conductive but less expensive can be employed. With the low cost for a design modification and manufacturing, the printed circuit board, even when the specification of the microcomputer or the like employed as the second circuit element 24 has been modified, the modification can be easily made by modifying the shape of the conductive pattern of the second circuit board 20. In addition, the second circuit board 20 made of an insulating material, such as an epoxy resin, has a lower thermal conductivity than the first circuit board 18 made of a metal. Accordingly, the heat conduction is suppressed by the second circuit board 20, whereby the heat generated in the first circuit element 22, which is the power transistor, is prevented from being conducted to the second circuit element 24, which is the microcomputer.

The first circuit element 22 is an element electrically connected to the conductive pattern 38 formed on the upper face of the first circuit board 18. As the first circuit element 22, a power transistor for switching a current equal to or more than one ampere is employed, for example. Here, a bipolar transistor, a field effect transistor (FET), or an insulated gate bipolar transistor (IGBT) is employed as the power transistor. In addition, as the first circuit element 22, an element other than the transistor also can be generally employed, and for example, an active element, such as an LSI or a diode, or a passive element, such as a chip capacitor or a chip resistor, is employed.

Additionally, if the first circuit element 22 is a semiconductor element, such as a power transistor, the rear face thereof is fixedly secured via a conductive adhesive, such as solder. In addition, a heat sink made of a metal, such as copper, may be provided between the first circuit element 22 and the conductive pattern 38. Then, an electrode formed on the upper face of the first circuit element 22 is connected to the conductive pattern 38 via a metal thin wire 42.

In addition, a diode constituting a rectifier circuit, a coil and a capacitor constituting a smoothing circuit, a driver IC which applies a control signal to the control electrode of the above-described power transistor, a thermistor, and the like are employed as the first circuit element 22.

The second circuit element 24 is an element electrically connected to the conductive pattern 21 formed in the surface of the second circuit board 20, and a circuit element having a lower operating temperature than the first circuit element 22 is generally employed. As a specific example, for example, a microcomputer, an aluminum electrolytic capacitor, and the like are mounted on the second circuit board 20 as the second circuit element 24. In addition, as the second circuit element 24, an active element and a passive element are generally employed as is the case with the first circuit element 22. Alternatively, a crystal oscillator or a semiconductor memory may be employed as the second circuit element 24. In addition, the second circuit element 24 may be fixedly secured only to the upper face of the second circuit board 20, or may be fixedly secured only to the lower face, or may be fixedly secured to both sides.

Additionally, as shown in FIG. 1B, an LSI as the microcomputer is mounted on the upper face of the second circuit board 20, in the form of a resin sealed package. However, the microcomputer may be fixedly secured to the conductive pattern 21 formed in the surface of the second circuit board 20, in the form of a bare chip.

The first sealing resin 14 is formed so as to cover the entire upper face of the first circuit element 22 and the first circuit board 18. The first sealing resin 14 is made of a resin material, such as an epoxy resin in which a filler, such as alumina ($Al_2O_3$) or silica ($SiO_2$), is mixed. In this way, the moisture resistance of the first circuit element 22 is improved by the first circuit element 22 being sealed with the first sealing resin 14. In addition, since a connected portion (made of a bonding material, such as solder) between the first circuit element 22 and the conductive pattern 38 is covered with the first sealing resin 14, the vibration resistance of this connected portion is improved. In addition, the first sealing resin 14 made of a resin, in which a filler is mixed, has a light shielding property that does not allow light to pass therethrough. Accordingly, since the first sealing resin 14 having a light shielding property covers the conductive pattern 38 and the first circuit element 22, which are formed on the upper face of the first circuit board 18, the shape of the conductive pattern 38 and the position of the first circuit element 22 may be concealed. Here, as shown in FIG. 1B, the first sealing resin 14 is formed so as to cover the first circuit element 22 and the metal thin wire 42 used for the connection thereof. However, the first circuit element 22 does not need to be completely covered with the first sealing resin 14. Alternatively, the upper end part of the first circuit element 22 may project upward from the upper face of the first sealing resin 14 while the connected portion between the first circuit element 22 and the conductive pattern 38 being covered with the first sealing resin 14.

The first sealing resin 14 is formed inside of the side wall of the case member 12, specifically, in a space surrounded by the first circuit board 18, and the second circuit board 20, but the first sealing resin 14 is not formed so as to completely fill into this space. Accordingly, the hollow portion 26, in which the first sealing resin 14 is not filled, is provided in the internal space of the case member 12. In other words, the first sealing resin 14 is in contact with the first circuit board 18 and the first circuit element 22, but is not in contact with the second circuit board 20 and the second circuit element 24. In addition, the peripheral region of the upper face of the first circuit board 18 is in contact with the case member 12 and the other region thereof is covered with the first sealing resin 14.

The second sealing resin 16 is formed so as to cover the entire upper face of the second circuit element 24 and the second circuit board 20, and is made of a resin material, in which a filler is mixed, as is the case with the first sealing resin 14. Since the second sealing resin 16 covers the second circuit element 24 and the second circuit board 20, the moisture resistance and the vibration resistance of the second circuit element 24 are improved and also the shape of the conductive pattern 21 provided on the upper face of the second circuit board 20 and the arrangement of the second circuit element 24 are concealed. Here, the second sealing resin 16 does not necessarily need to be formed so as to completely cover the second circuit element 24. The second sealing resin 16 may be formed so that the upper part of the second circuit element 24 may project upward from the upper face of the second sealing resin 16 while the connected portion between the second circuit element 24 and the conductive pattern 21 being covered.

As shown in FIG. 1A, the opening on the front side, of the figure, of the case member 12 is entirely covered with the second sealing resin 16, and a first lead 28 and a second lead 30 are led from the surface of the second sealing resin 16 to the outside. The details of the first lead 28 and the second lead 30 will be described with reference to FIG. 2A. The first lead 28 and the second lead 30 serve as a connecting means for connecting a circuit provided inside the hybrid integrated circuit device 10 to the outside. Additionally, as shown in FIG. 1B, the first lead 28 and the second lead 30 serve also as a connecting means for electrically connecting the first circuit element 22 mounted on the first circuit board 18 and the second circuit element 24 mounted on the second circuit board 20.

As shown in FIG. 1B, in this embodiment, the first sealing resin 14 is provided so as to cover the first circuit element 22, while the hollow portion 26 (internal space) is provided inside the case member 12 to cause the hollow portion 26 to communicate with the outside through the communicating opening 15A.

By providing the communicating opening 15A in this way, the misoperation of the second circuit element 24, which is a microcomputer having a low operating temperature, due to a heat generated in the first circuit element 22 being conducted to the second circuit element 24 is prevented.

Specifically, in this embodiment, by providing two overlaid circuit boards (the first circuit board 18 and second circuit board 20) and then incorporating a circuit element into the respective circuit boards, a power block consisted of a power transistor and a control block for controlling this power block are incorporate in one package of the hybrid integrated circuit device 10. In addition, in order to improve the moisture resistance and the vibration resistance of the elements to be mounted, the circuit elements mounted on each of the circuit boards need to be sealed with a sealing resin. For example, as shown in FIG. 1B, the first sealing resin 14 is formed inside the case member 12 so as to cover the first circuit element 22 arranged in the first circuit board 18, and In addition, the second sealing resin 16 is formed so as to cover the second circuit element 24 fixedly secured to the upper face of the second circuit board 20.

Here, for example, considering a case where a power transistor is employed as the first circuit element 22 and a microcomputer is employed as the second circuit element, the microcomputer may cause a misoperation due to a heat generated in the power transistor. Specifically, during operation of the hybrid integrated circuit device 10, the temperature Tc outside the device is guaranteed so as not to be more than 100° C., and the temperature (Tj) of the first circuit element 22 incorporated into the device is guaranteed so as to not be higher than 150° C. On the other hand, the operating temperature of the microcomputer, which is the second circuit element 24, is lower than that of the power transistor, such as an IGBT, and is no higher than 85° C., for example. Accordingly, if the first sealing resin 14 is formed so as to completely fill the internal space of the case member 12, a heat generated in the first circuit element 22 conducts to the second circuit element 24, which is the microcomputer, via the first sealing resin 14. As a result, the second circuit element 24, which is the microcomputer, is heated to 85° C. or higher and the operation thereof may become unstable.

For this reason, in this embodiment, as shown in FIG. 1B, the inside of the case member 12 is not completely filled with the first sealing resin 14 for sealing the first circuit element 22, so that the hollow portion 26, which is an unfilled region in which the first sealing resin 14 is not filled, is provided in the internal space of the case member 12. In addition, the hollow portion 26 is caused to communicate with the outside with the communicating openings 15A and 15B which are provided by partially opening the case member 12. With this configuration, even when the air inside the case member 12 is heated to a high temperature with the generation of the heat by the operation of the first circuit element 22, which is the power transistor, the heated air is released to the outside through the communicating openings 15A and 15B. As a result, the heat generated in the first circuit element 22 is prevented from being conducted to the second circuit element 24 (the microcomputer). Accordingly, the second circuit element 24, which is the microcomputer, is prevented from being heated equal to the operating temperature (85 degrees, for example) or higher, so that the microcomputer can operate stably.

In addition, even if an aluminum electrolytic capacitor, which is likely to be deteriorated due to heating, is employed as the second circuit element 24, the configuration of this embodiment described above can suppress an increase in temperature of the aluminum electrolytic capacitor so as to prevent the degradation thereof.

In addition, in this embodiment, the first sealing resin 14 for covering the first circuit element 22 is not completely filled into the internal space of the case member 12, so that the hollow portion 26, which is a region in which the sealing resin is not filled, is provided inside the case member 12. This configuration also allows the hollow portion 26, in which an air is present, to serve as a heat insulating layer, whereby a heat generated in the first circuit element 22 is prevented from being conducted to the second circuit element 24. Additionally, as described above, since the first sealing resin 14 is made of a resin in which a filler is mixed, and has a low thermal resistance, the heat generated in the first circuit element 22 is easily conducted to other constituent elements via the first sealing resin 14. However, in this embodiment, as described above, the heat transfer is restricted by providing the hollow portion 26 in the case member 12, so that the misoperation of the second circuit element 24 due to the heat generated in the first circuit element 22 can be prevented.

Figure 2A:
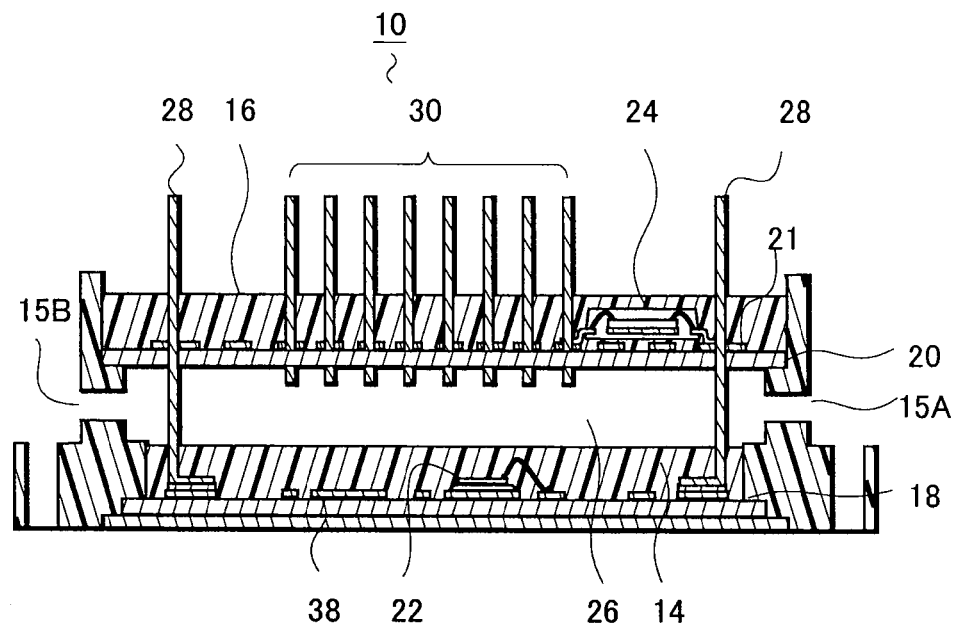
FIG. 2A and FIG. 2B are views showing the hybrid integrated circuit device which is an embodiment of the circuit device of the present invention.
Figure 2B:
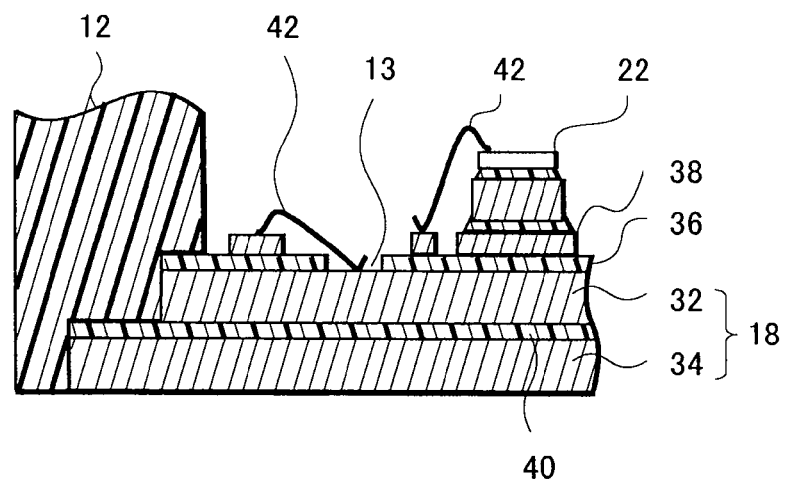

The configuration of the above-described hybrid integrated circuit device 10 is further described with reference to FIG. 2A and FIG. 2B. FIG. 2A is a cross sectional view of the hybrid integrated circuit device 10 for illustrating the configuration of leads, and FIG. 2B is a cross sectional view for explaining the configuration of the first circuit board 18.

As shown in FIG. 2A, the first lead 28 and the second lead 30 are provided in the hybrid integrated circuit device 10.

The lower end of the first lead 28 is fixedly secured to a pad consisted of a conductive pattern 38 formed on the upper face of the first circuit board 18. The lower end of the first lead 28 is bonded to the pad-like conductive pattern 38 via a conductive adhesive, such as solder. The upper end of the first lead 28 is led to the outside penetrating the first sealing resin 14, the second circuit board 20, and the second sealing resin 16. Here, in a portion where the first lead 28 penetrates the second circuit board 20, the first lead 28 is sometimes connected to the second circuit element 24 formed on the upper face of the second circuit board 20 or is sometimes not connected thereto. The cases where the first lead 28 is connected to the second circuit element 24 include a case where the second circuit element 24 mounted on the second circuit board 20 and the first circuit element 22 mounted on the first circuit board 18 are electrically connected to each other via the first lead 28. Meanwhile, the cases where the first lead 28 and the second circuit element 24 are not connected to each other may include, for example, a case where a power supply current supplied from the outside or a current converted by an inverter circuit provided in the first circuit board 18 passes through the first lead 28.

The lower end of the second lead 30 is connected to the conductive pattern 21 provided on the upper face of the second circuit board 20 and the upper end thereof projects upward penetrating the second sealing resin 16. The lower end of the second lead 30 is inserted into a pore which is provided penetrating the second circuit board 20, and a portion near the lower end thereof is secured to the pore. This portion has a function to allow an electric signal, which is inputted to and outputted from the second circuit element 24 mounted on the second circuit board 20, to pass therethrough. Here, the conductive pattern 21 formed on the upper face of the second circuit board 20 and the second lead 30 are connected to each other via a conductive adhesive, such as solder.

As shown in FIG. 2B, in this embodiment, the first circuit board 18 is formed by stacking a mounting substrate 32 on an insulating substrate 34.

The mounting substrate 32 is a metal substrate containing aluminum (Al) as the primary material, with the thickness of around 1.0 mm to 2.0 mm and the upper face and the lower face thereof are covered with anodic oxide film (a film made of $Al_2O_3$). The upper face of the mounting substrate 32 is covered with an insulating layer 36 made of a resin material, such as an epoxy resin in which a filler is highly filled. The thickness of the insulating layer 36 is around 50 μm for example. In addition, the conductive pattern 38 with the thickness of around 50 μm made of copper is formed on the upper face of the insulating layer 36, and the first circuit element 22 is mounted on the conductive pattern 38.

Additionally, an exposed portion 13 is provided by partially removing the insulating layer 36, and the mounting substrate 32 appeared from the exposed portion 13 and the conductive pattern 38 are connected to each other via the metal thin wire 42. Connecting the mounting substrate 32 and the conductive pattern 38 to each other via the exposed portion 13 in this way allows the potential of the mounting substrate 32 to be set at a fixed potential (earth potential or power supply potential). Accordingly, the mounting substrate 32 contributes to the increase of the shielding effect for shielding noise from the outside. In addition, since the potentials of a part of the conductive pattern 38 and the mounting substrate 32 become the same, a parasitic capacitance occurring between the both can be reduced.

The rear surface of the mounting substrate 32 having the above-described structure is bonded to the upper face of the insulating substrate 34 via an adhesive made of a silicon resin.

The insulating substrate 34 is made of a metal, such as aluminum, as is the case with the mounting substrate 32, and the plane size thereof is formed larger than that of the mounting substrate 32. Accordingly, the end portion of the insulating substrate 34 is spaced apart from the end portion of the mounting substrate 32. Additionally, the upper face of the insulating substrate 34 is covered with an insulating layer 40 made of a resin material, such as a polyimide resin. In addition, the lower face of the insulating substrate 34 is arranged on the same plane as the lower end of the side wall of the case member 12.

As described above, both of the heat release property and the withstand voltage of the first circuit board 18 can be kept at a high level with the configuration of the first circuit board 18 by stacking the mounting substrate 32 on the insulating substrate 34. Specifically, as described above, since the mounting substrate 32 is connected to the earth potential for example, by being connected to the conductive pattern 38, an exposure of the rear surface of the mounting substrate 32 to the outside might cause a short circuit. The insulating substrate 34 is provided in order to prevent this short circuit. The upper face of the insulating substrate 34 and the lower face of the mounting substrate 32 are insulated from each other by the insulating layer 40 provided on the upper face of the insulating substrate 34. In addition, the side face of the mounting substrate 32 and the side face of the insulating substrate 34 are prevented from being short-circuited to each other by keeping a distance between the end portion (side face) of the insulating substrate 34 and the end portion (side face) of the mounting substrate 32, although the side faces of the both substrates are the faces where a metallic material, such as aluminum, constituting the respective substrates appears.

In addition, since both of the mounting substrate 32 and the insulating substrate 34 are made of a metal, such as aluminum being excellent in heat release property, a heat generated in the first circuit element 22 is excellently released to the outside via the mounting substrate 32 and the insulating substrate 34.

Figure 3A:
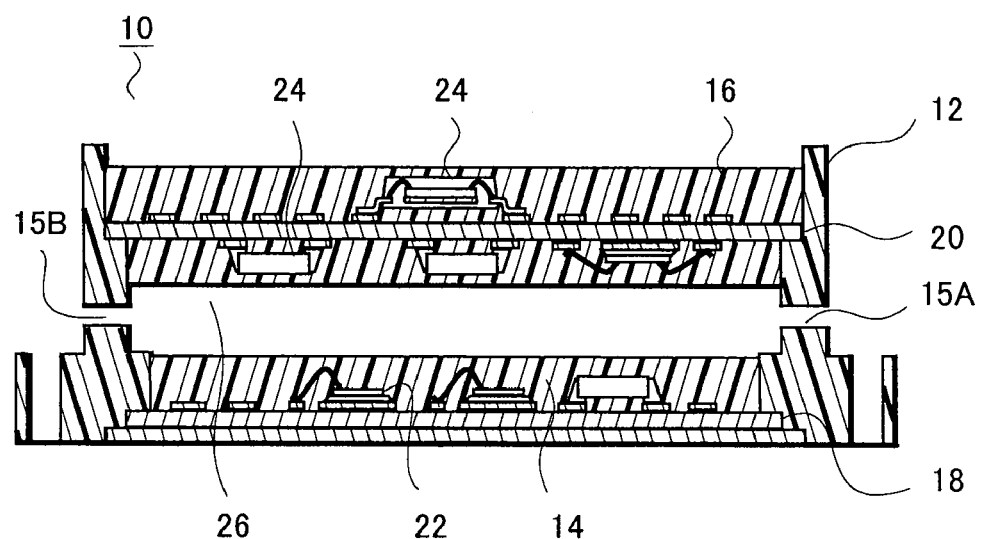
FIG. 3A and FIG. 3B are views showing a hybrid integrated circuit device which is an embodiment of the circuit device of the present invention.

Another form of the hybrid integrated circuit device 10 is described with reference to FIG. 3A. Here, the second circuit elements 24 are mounted respectively on both of the upper face and the lower face of the second circuit board 20. Then, the second sealing resin 16 is formed so as to cover both of the upper faces and the lower faces of the second circuit elements 24 and the second circuit board 20.

By providing the second circuit element 24 also on the lower face of the second circuit board 20 in this way, a greater number of circuit elements can be incorporated in the hybrid integrated circuit device 10. In addition, the second circuit element 24 provided on the rear surface of the second circuit board 20 is sealed with the second sealing resin 16, thereby improving the moisture resistance and the vibration resistance of these elements.

Additionally, even in such a case, the hollow portion 26, in which a resin is not filled, is provided inside the case member 12, and the hollow portion 26 communicates with the outside through the communicating openings 15A and 15B.

Figure 3B:
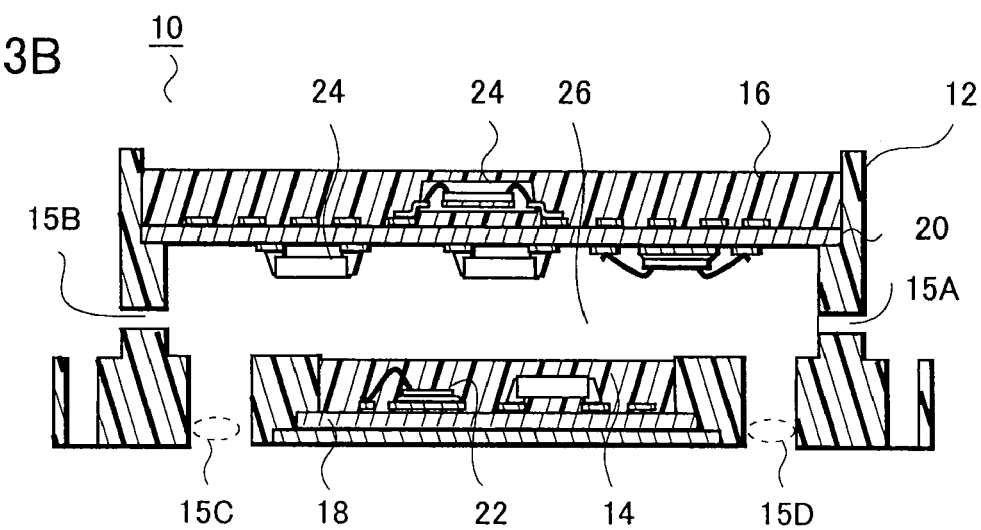

In addition, the configuration of still another form of the hybrid integrated circuit device 10 is described with reference to FIG. 3B. In the hybrid integrated circuit device 10 shown in FIGS. 1A and 1B, the communicating opening 15A is provided only in the side wall part of the case member 12. However, in this form, communicating openings 15C and 15D are provided by partially opening the bottom of the case member 12. As shown in FIG. 3B, because the area of the first circuit board 18 is smaller than that of the second circuit board 20, a margin region is formed around the incorporated first circuit board 18. Here, the communicating openings 15C and 15D are provided by opening the margin region of the case member 12. With this configuration, a high temperature air in the hollow portion 26 that is heated by heat generated in the first circuit element 22 can be released to the outside more frequently, so that the temperature of the entire device can be lowered.

Figure 4:
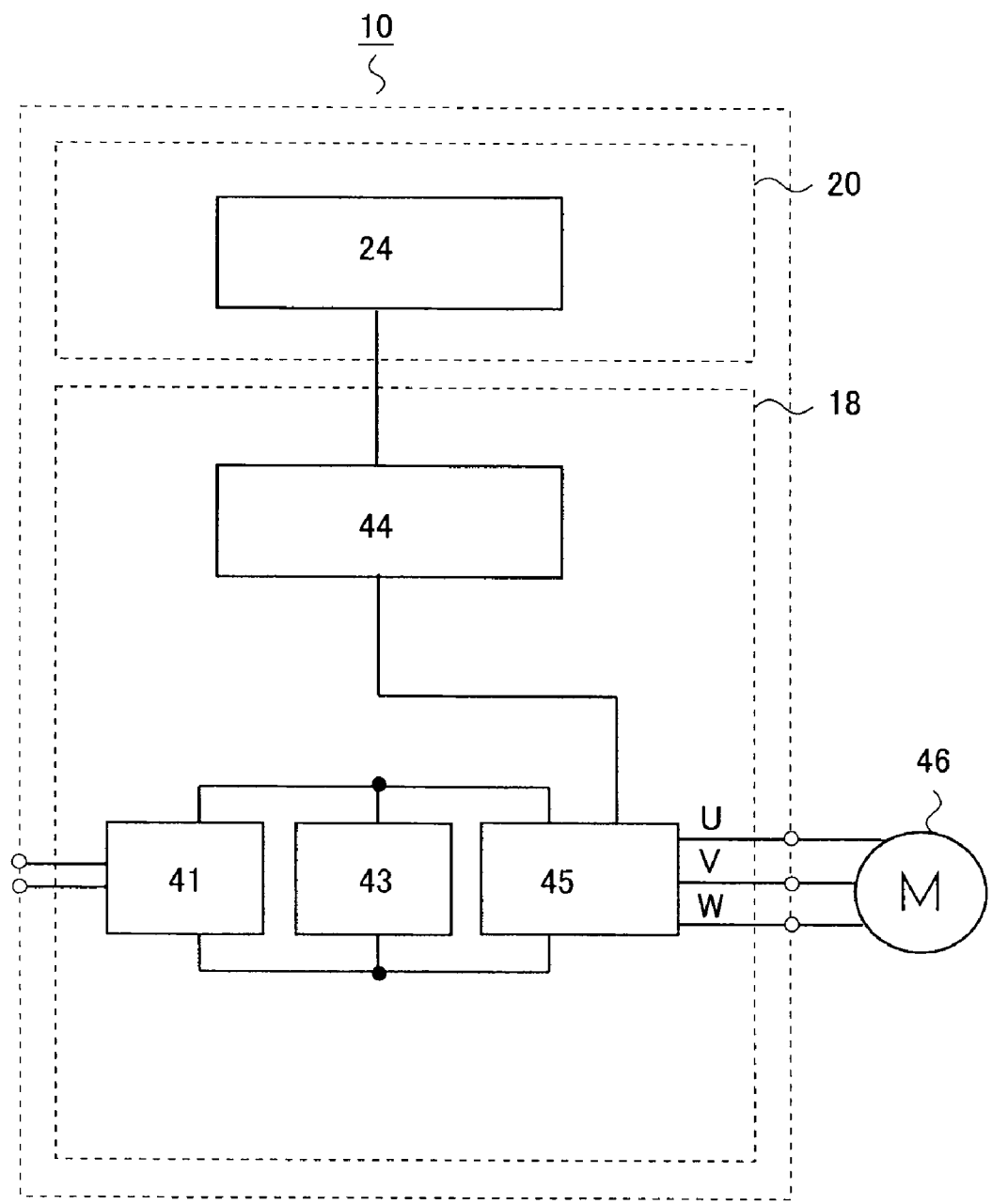
FIG. 4 is a block diagram showing a circuit incorporated in the hybrid integrated circuit device which is an embodiment of the circuit device of the present invention.

Next, an example of the circuit built in the hybrid integrated circuit device 10 is described with reference to FIG. 4. Here, an inverter circuit including a switching circuit 45 consisted of a plurality of power transistors is formed on the first circuit board 18, while the second circuit element 24 (microcomputer) in which a control circuit for controlling this inverter circuit is configured is mounted on the second circuit board 20. More specifically, a rectifier circuit 41, a smoothing circuit 43, a switching circuit 45, and a driver IC 44 are incorporated in the first circuit board 18.

The operation of each of the circuits incorporated in the hybrid integrated circuit device 10 is described below. Firstly, a reference signal having a frequency corresponding to a rotational speed is inputted to the second circuit element 24 (microcomputer), which is mounted on the second circuit board 20, so that three sinewave control signals each having a pulse width being modulated, and a phase difference by 120 degrees, are generated. The control signal generated by the second circuit element 24 is inputted to the first circuit board 18 via the first lead 28 (see FIG. 2A).

The control signal inputted to the first circuit board 18 is boosted to a specified voltage by a driver IC 44 and then is applied to a control electrode of a power transistor (IGBT, for example) constituting the switching circuit 45.

On the other hand, an alternating current power inputted from the outside is converted into a direct current power by the rectifier circuit 41, and then the voltage thereof is kept constant by the smoothing circuit 43, and this voltage is inputted to the switching circuit 45.

Then, the switching circuit 45 generates three-phase pulse-width-modulated sinewave voltages (U, V, W), each having a phase difference by 120 degrees, and the voltages thus generated are supplied to a motor 46. As a result, a load current that approximates the sinewave flows into the motor 46, so that the motor 46 rotates at a predetermined number of rotations.

The power transistors included in the switching circuit 45 generates a large amount of heat during the operation of the switching circuit 45. However, as shown in FIG. 1B, a heat generated in the first circuit element 22, which is the power transistor, is once conducted to the air in the hollow portion 26 and is then released to the outside through the communicating openings 15A, 15B. As a result, misoperation of the second circuit element 24 due to the heat generated in the first circuit element 22 is suppressed.

Figure 5A:
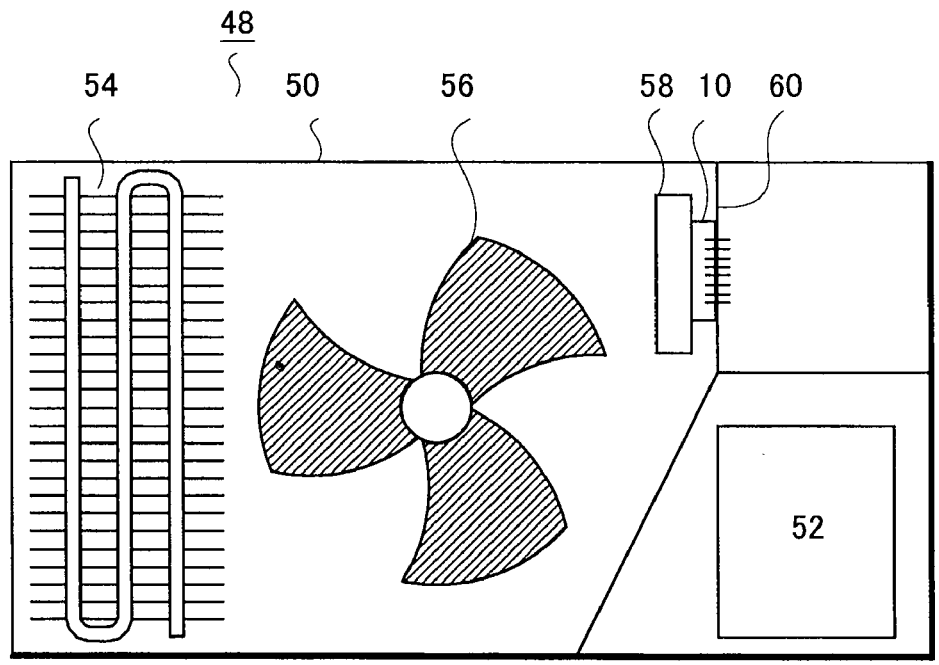
FIG. 5A is a view showing an outdoor unit, into which the hybrid integrated circuit device which is an embodiment of the circuit device of the present invention is incorporated.
Figure 5B:
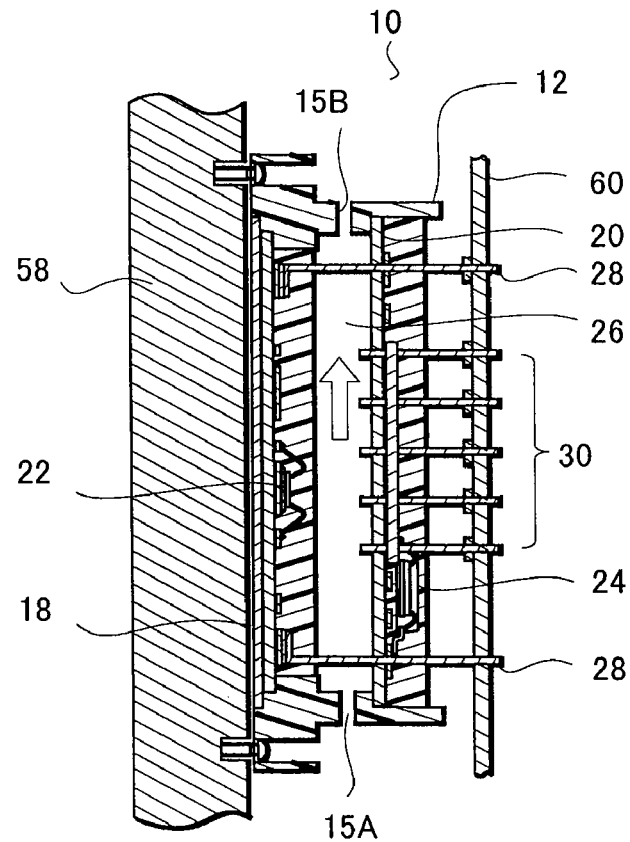
FIG. 5B is a cross sectional view of a portion to which the hybrid integrated circuit device is attached.

Next, the configuration of an outdoor unit 48 of an air conditioner, in which the hybrid integrated circuit device 10 having the above-described configuration is incorporated, is described with reference to FIG. 5A and FIG. 5B. FIG. 5A is a cross sectional view showing the configuration of the outdoor unit 48, and FIG. 5B is a cross sectional view of the hybrid integrated circuit device 10 being mounted on the outdoor unit 48.

The outdoor unit 48 mainly includes a condenser 54, a fan 56, a compressor 52, and the hybrid integrated circuit device 10 which are incorporated inside a housing 50.

The compressor 52 has a function to compress a refrigerant, such as ammonia, using the driving force of the motor. Then, the refrigerant compressed by the compressor 52 is delivered to the condenser 54, and the wind from the fan 56 blows to the condenser 54. Accordingly a heat contained in the refrigerant inside the condenser 54 is released to the outside. In addition, after being expanded, this refrigerant is delivered to an evaporator existing in the room so as to cool the air in the room.

The hybrid integrated circuit device 10 of this form has a function to control the rotation of the motor for driving the compressor 52 or the fan 56, and is fixedly secured to a mounting substrate 60 provided inside the outdoor unit 48.

FIG. 5B shows a structure in which the hybrid integrated circuit device 10 is mounted. Here, the first lead 28 and the second lead 30 are inserted into the mounting substrate 60 to be mounted thereon. The rear surface of the first circuit board 18 on which the power transistors are mounted is in contact with a smooth surface of a heat sink 58. The hybrid integrated circuit device 10 can be attached to the heat sink 58 by screwing the case member 12 of the hybrid integrated circuit device 10 into the heat sink 58. Here, the heat sink 58 is formed by integrally molding a metal, such as copper or aluminum. The surface of the heat sink being in contact with the hybrid integrated circuit device 10 is smooth, and the surface opposite thereto is irregular. With such a configuration, a heat generated in the first circuit element 22, which is the power transistor, is conducted to the internal space of the outdoor unit 48 via the first circuit board 18 and the heat sink 58, and is finally released to the outside of the outdoor unit 48 by the blowing operation of the fan 56.

In addition, as shown in FIG. 5B, it is preferable that the hybrid integrated circuit device 10 be arranged so that the first circuit board 18 and the second circuit board 20 may be in the vertical state. This configuration allows the communicating opening 15A to be positioned at the lower end of the hollow portion 26 and the communicating opening 15B to be positioned at the upper end of the hollow portion 26. Accordingly, once the air inside the hollow portion 26 is heated by the operation of the first circuit element 22, the heated air is automatically released upward through the communicating opening 15B. Then, an amount of a fresh air equivalent to that of the released air is admitted to the hollow portion 26 from the communicating opening 15A. Consequently, since the air inside the hollow portion 26 is frequently ventilated, overheating of the second circuit element 24 (microcomputer) by the heat generated in the first circuit element 22 is prevented.

Second Embodiment

A second embodiment is described with reference to FIG. 6A, FIG. 6B and FIG. 7. The contents of this embodiment are basically the same as those of the first embodiment, and the difference therebetween lies in the configuration of the opening 19 for allowing the inside of the device to communicate with the outside.

The configuration of the hybrid integrated circuit device 10 according to this embodiment of the present invention is described with reference to FIG. 6A and FIG. 6B. FIG. 6A is a perspective view showing the hybrid integrated circuit device 10, and FIG. 6B is a cross sectional view of the hybrid integrated circuit device 10 taken along a B-B' line of FIG. 6A.

Figure 6A:
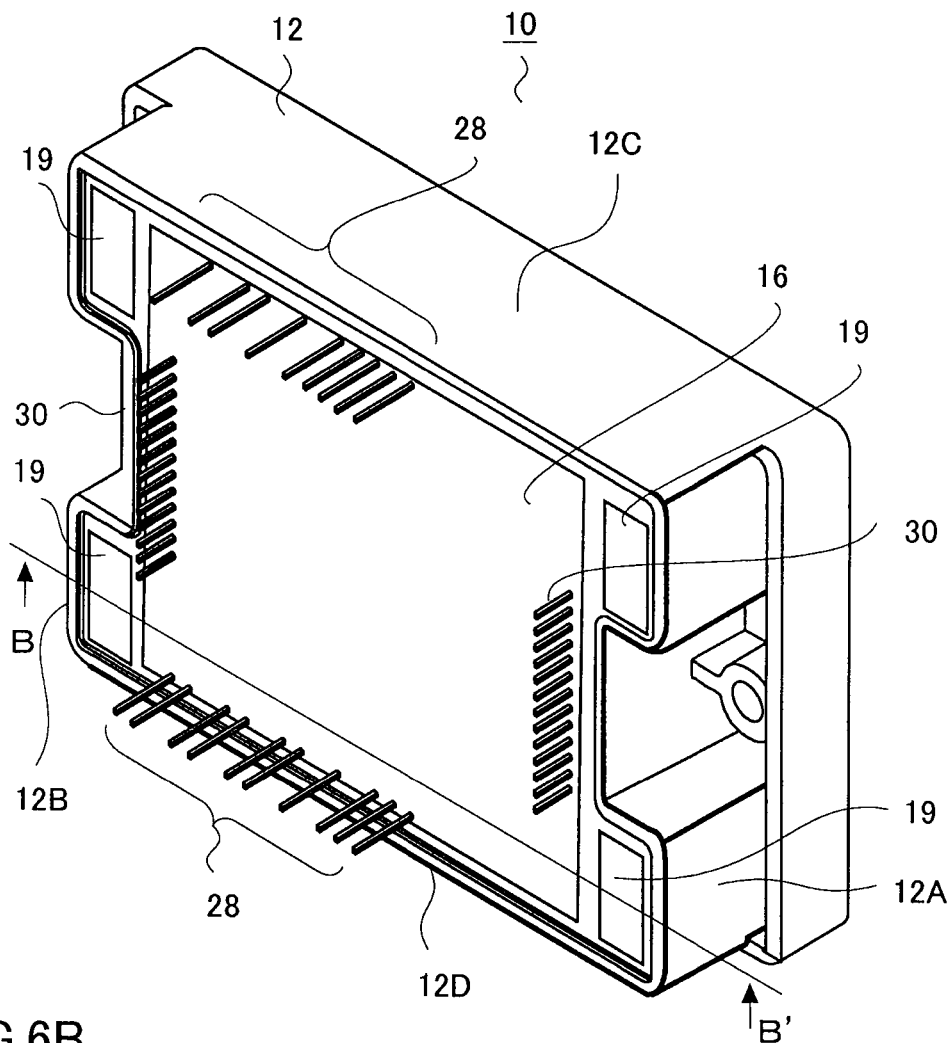
FIG. 6A and FIG. 6B are views showing a hybrid integrated circuit device which is an embodiment of the circuit device of the present invention.

As shown in FIG. 6A, four openings 19 for allowing the hollow portion 26 of the case member 12 to communicate with the outside are provided at the corners of the case member 12. Each of the opening 19 exhibits a square shape in plan view, and is formed by causing the side wall of the case member 12 to partially project outwardly.

The air in the hollow portion 26 of the case member 12 is ventilated through these openings 19, so that a heat generated in a circuit element which is incorporated in the hybrid integrated circuit device 10 can be excellently released to the outside. Accordingly, the overheating of these circuit elements is suppressed. Additionally, in a step of forming the first sealing resin 14, the opening 19 serves also as a path for allowing the first sealing resin 14 to be injected into the internal space of the case member 12.

Figure 6B:
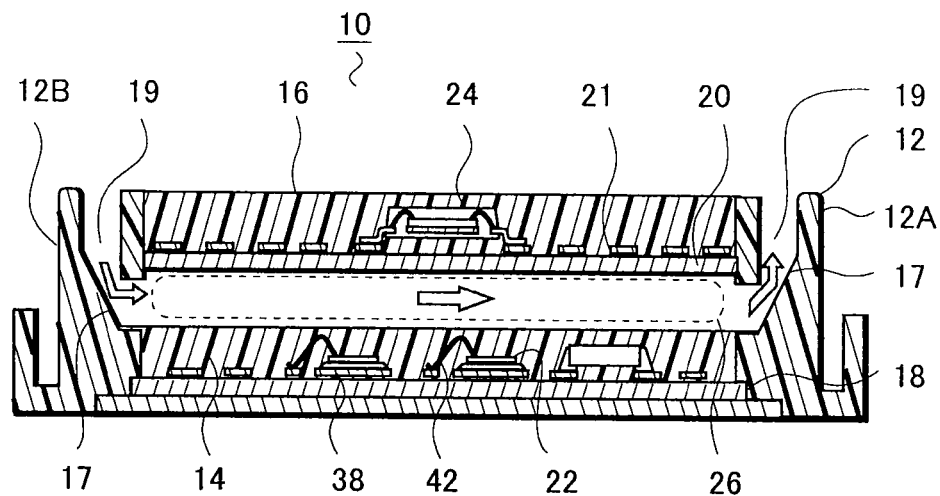

As shown in FIG. 6B, the inner wall of the second side wall part 12B on the left of the figure forms an inclined plane 17. In addition, the inner wall of the first side wall part 12A on the right of the figure also forms the inclined plane 17. Alternatively, the shape of the inclined plane 17 may be rounded, although it is rectilinear here.

Movement of air through the openings 19 to the hollow portion 26 of the hybrid integrated circuit device 10 is described. In FIG. 6B, the movement of air is indicated by arrows. The air having entered the hollow portion 26 from the opening 19 on the side of the second side wall part 12B comes in contact with the inclined plane 17 of the second side wall part 12B and then smoothly moves to the hollow portion 26. After that, the air having entered moves in the hollow portion 26 from the left side of the figure to the right side thereof, and comes in contact with the inclined plane 17 of the first side wall part 12A, and then is released to the outside from the opening 19.

Since the air in the hollow portion 26 is excellently released to the outside through the above described path, the air in the hollow portion 26 containing the heat released from the first circuit element 22 and the second circuit element 24 is excellently released to the outside through the opening 19. In addition, an amount of a fresh air equivalent to that of the released air is admitted into the hollow portion 26 through the opening 19.

Alternatively, if the first circuit board 18 and the second circuit board 20 are vertically arranged so as to be parallel to the direction to which the gravity acts, so that the above-described ventilation effect can be increased further. Specifically, the air inside the hollow portion 26 heated by heat generated in the first circuit element 22 and the second circuit element 24 is automatically released to the outside from the opening 19 positioned on the upper side, and the amount of fresh air equivalent to that of the released air is admitted into the hollow portion 26 from the opening 19 on the lower side.

Figure 7:
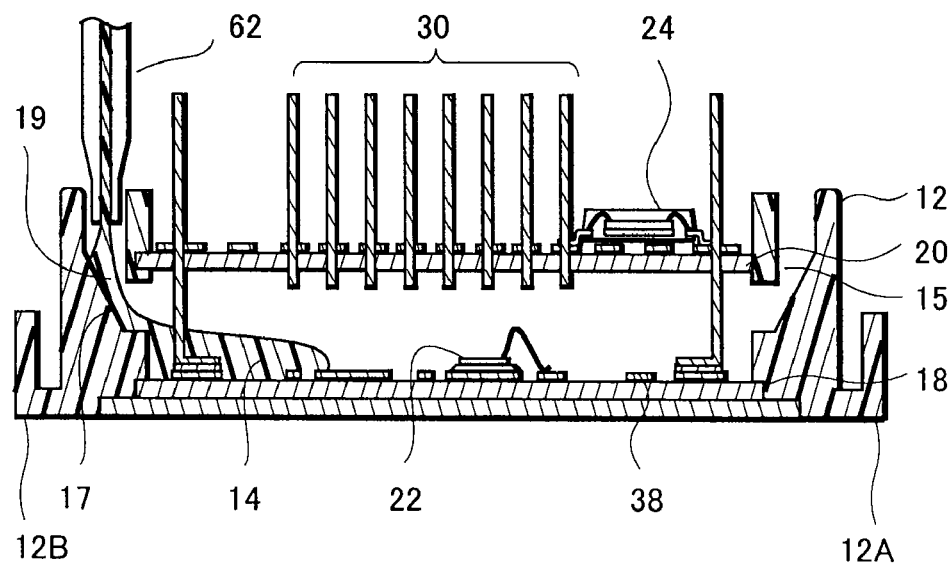
FIG. 7 is a cross sectional view showing a hybrid integrated circuit device which is an embodiment of the circuit device of the present invention.

As shown in FIG. 7, the opening 19 provided in the case member 12 also serves as an inlet for injecting a liquid resin into the case member in a resin sealing step.

Specifically, in this step, the first sealing resin 14 is injected into the internal space of the case member 12 from the opening 19 provided in the case member 12. The first sealing resin 14 used in this step is a thermosetting resin or a thermoplastic resin filled with a filler such as granular alumina. Then, the first sealing resin 14 supplied from a nozzle 62 is in a liquid or semi-solid state, and is heat-cured after being filled.

Here, the first sealing resin 14 is supplied from the nozzle 62 to the internal space in the case member 12 through the opening 19 provided in the second side wall part 12B on the left of the figure. Additionally, the opening 19 is also provided in the first side wall part 12A positioned on the right of the figure, and the amount of air in the internal space equivalent to the volume of the first sealing resin 14 supplied from the nozzle 62 is released to the outside through the opening 19 provided in the first side wall part 12A. With the continuous supply of the first sealing resin 14 by the nozzle 62, the upper face of the first circuit board 18 and the first circuit element 22 are sealed with the first sealing resin 14.

In addition, in this step, the first sealing resin 14 in liquid state supplied from the nozzle 62 firstly comes in contact with the inclined plane 17 provided in the inner wall of the second side wall part 12B. Subsequently, the first sealing resin 14 being excellent in fluidity enters into the internal space of the case member 12 along the inclined plane 17. The injected first sealing resin 14 is heat-cured.

Other configuration and the manufacture method are the same as those of the first embodiment.

Third Embodiment

The configuration of a circuit module of this embodiment is described with reference to FIGS. 8A, 8B, 9, 10, 11, 12 and 13.

Figure 8A:
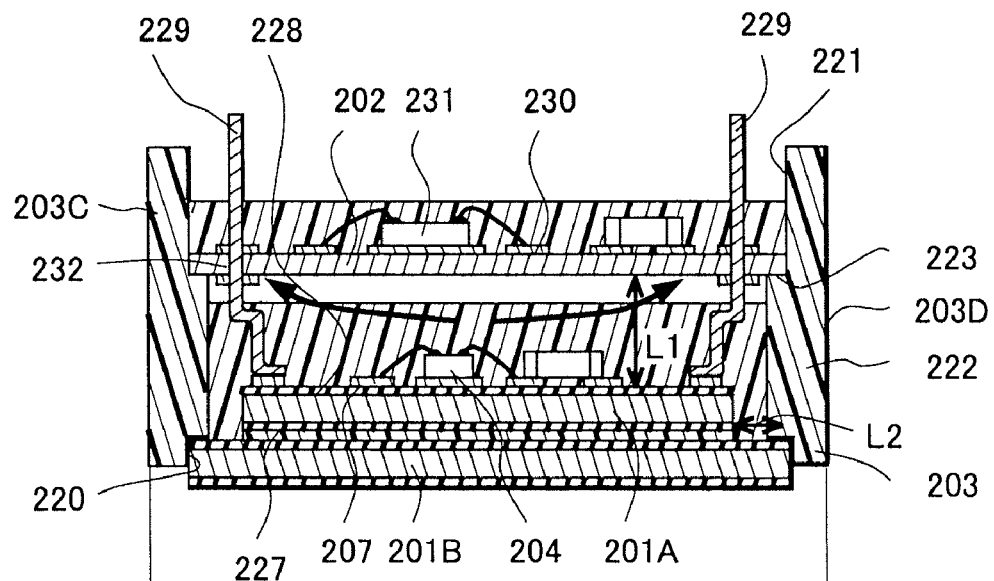
FIG. 8A and FIG. 8B are views showing a circuit module which is an embodiment of the circuit device of the present invention.

As shown in FIG. 8A, two metal substrates are employed in this embodiment. A lower metal substrate 201B is a base substrate, and is formed larger than the above first substrate 201A by L2 on each of the four sides of 201A. The distance L2, referred to as extending distance, improves the voltage resistance characteristic of the first substrate 201A and the rear surface of the base substrate 201B when the actual circuit module is formed.

Figure 8B:
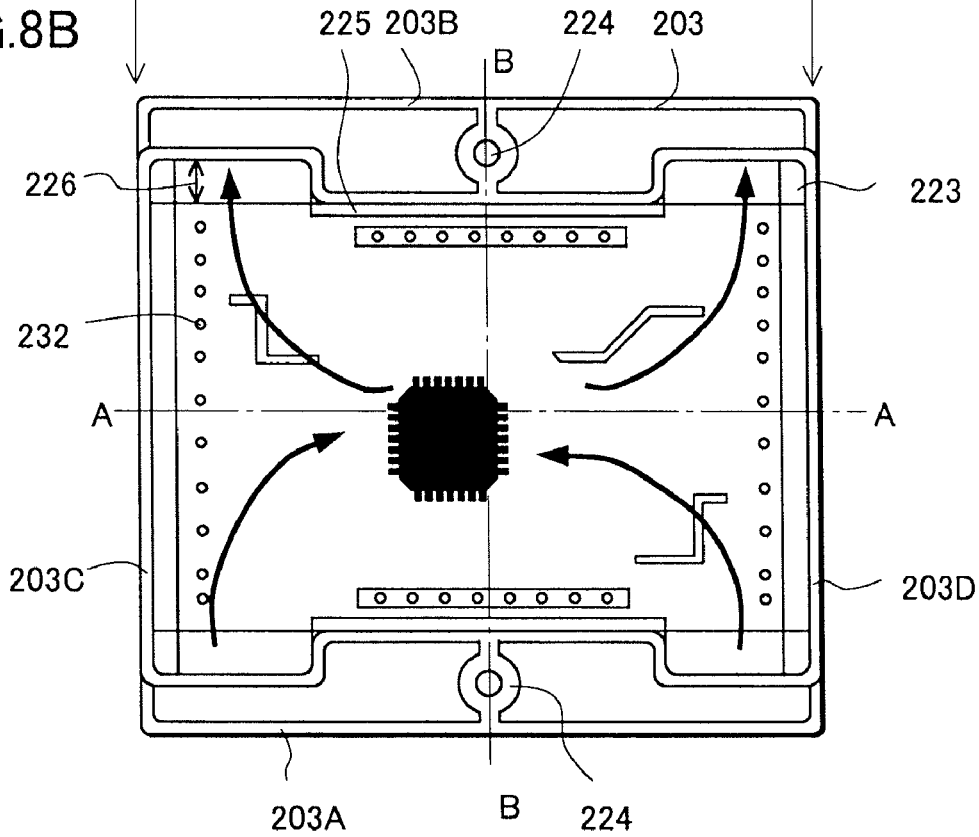

First, a case member 203 is described. The case member 203 is in the form such as a square pole with an interior area removed. In other words, the case member 203 is formed integrally with four side walls, i.e., 203A on a front side of the figure, 203B on a far side thereof, 203C on the left side thereof and 203D on the right side thereof. Accordingly, there are openings 220, 221 respectively on the lower side and the upper side. Inside the case member 203, there is a convex portion 222 facing inward. Accordingly, a contact part 223 for supporting the rear surface of the periphery of a second substrate 202 is formed at a position slightly below the upper opening. As shown in FIG. 8B, the contact part 223 is provided in the inner walls of the side walls 203C, 203D of the case member, and is in contact with the rear surfaces of the second substrate 202 in the vicinity of the left and right sides thereof. On the other hand, the inner walls of the side walls 203A, 203B of the case member are located so as to leave a portion 225 being in contact with the second substrate 202 and a spaced portion 226 in order to secure screw holes 224, 224. This spaced portion is formed so that a heat generating in a space between the second substrate 202 and the first substrate 201A may be released to the outside therethrough.

Next, the base substrate 201B and the first substrate 201A are described. These two substrates are made of a conductive material, such as Cu, Al, or Fe, as a primary material, or made of an alloy containing above materials. Alternatively, these two substrates may be made of a material excellent in thermal conductivity, or may be made of an insulating material, such as aluminum nitride or boron nitride. Generally, Cu or Al is employed from a viewpoint of cost. Here a description is made by employing Al.

Since the both of the substrates have conductivity, an insulation treatment is required. An anodic oxide film is applied to both sides of the base substrate 201B and the first substrate 201A for damage prevention. However, since the substrates are cut, Al appears in the center of the side faces thereof. The first substrate 201A being smaller in size than the 201B by the distance L2 on each of the four sides is secured onto the base substrate 201B with an insulating adhesive 227. In addition, the anodic oxide film is formed on the upper face of the first substrate 201A, an insulating coating film 228 covers the anodic oxide film, and a first conductive pattern 207 made of Cu is laminated on top of the insulating coating film 228. This conductive pattern is consisted of an island, wirings, an electrode pad, an electrode for a passive element, and the like. For example, a power semiconductor element 204 includes a BIP type power transistor, an MOS type power transistor, an IGBT, or the like, and is electrically connected to the island and is fixedly secured thereto. The surface electrode of this element and the electrode pad are connected to each other with a metal thin wire, for example. Other than these, a diode, a chip resistor, a chip capacitor, and the like are mounted. In addition, a pad for fixing a lead is provided on the sides of the first substrate 201A, and an external lead 229 is fixedly secured to this pad with a solder material. The external lead 229 has a length long enough to stick out from the head of the case member 203, and is inserted into a through-hole of the mounting substrate, which is separately prepared, to be electrically connected thereto.

The first module substrate obtained by bonding the base substrate 201B and the first substrate 201A together is fitted into the lower opening 220 of the case member 203. It has been described that the case member 203 has the convex portion 222. In other words, in the lower opening 220, an L-shaped step is provided in the inner sides of all the side walls, and the side faces of the base substrate 201B and parts of the upper face thereof, the parts forming a corner part together with this side faces, are in contact with the L-shaped step and fixedly secured thereto. Accordingly, the circuit module is completely shielded, except the opening 221, by the first module substrate that is fitted into the case member 203.

Next, the second substrate 202 is described. The second substrate 202 is made of a resin substrate, and is preferably a glass epoxy substrate called a printed circuit board, for example. One or more layers of conductive patterns are formed at least on the upper surface of the substrate 202. Generally, a form of the conductive pattern is selected from one layer on one side, two layers on two sides, four layers on two sides, and so on. Specifically, the number of layers of second conductive pattern 230 is determined on the basis of the density of elements to be mounted. The second conductive pattern 230 includes an island, wirings, an electrode pad, an electrode for a passive element, and the like, as is the case with the first conductive pattern 207. The element mounted on the second conductive pattern 230 is either an active element or a passive element, and here an element 231 featuring the present invention is mounted.

The element 231 is an IC which drives and controls the power semiconductor element 4, and is consisted of a microcomputer, for example. Other than this, the element 231 further is consisted of a transistor, a diode, a chip resistor, or a chip capacitor. Additionally, in the vicinity of the left and right sides of the second substrate 202, a through-hole 232 is provided into which the external lead 229 is inserted. With the through-hole 232, a circuit formed on the first substrate and a circuit formed on the second substrate 2 are electrically connected to each other.

The second module substrate 202 is provided inside the case member 203 through the upper opening 221 thereof. As described above, the contact part 223 is provided on the inner wall of the case member 203, and the second substrate 202 is arranged on the contact part 223.

For the purpose of preventing the crack of the solder material or the penetration of the external atmosphere to inside of the case member 203 through the spaced portion 226, a resin for completely sealing the elements of the first substrate is provided by potting or other means before the second substrate 202 is provided, as shown in FIG. 8A. The distance between the upper surface of the first substrate 201A and the rear surface of the second substrate 202 is set to L1, and the thickness of the coating resin is set to S1, and a space part S2 is provided. The air in the space part S2 is heated by the first module substrate and is released to the outside through the spaced portion 226. Accordingly, at least two spaced portions 226 are formed to make a circulation effect. Actually, four spaced portions 226 are formed in this embodiment.

Additionally, as required, a resin for completely sealing the elements is provided also on the second substrate 202. In this embodiment, the driver element 231 is mounted in a bare state in FIG. 8A, while in FIG. 8B a resin-sealed semiconductor element is formed. However, either one can be applicable in actual cases.

Figure 9:
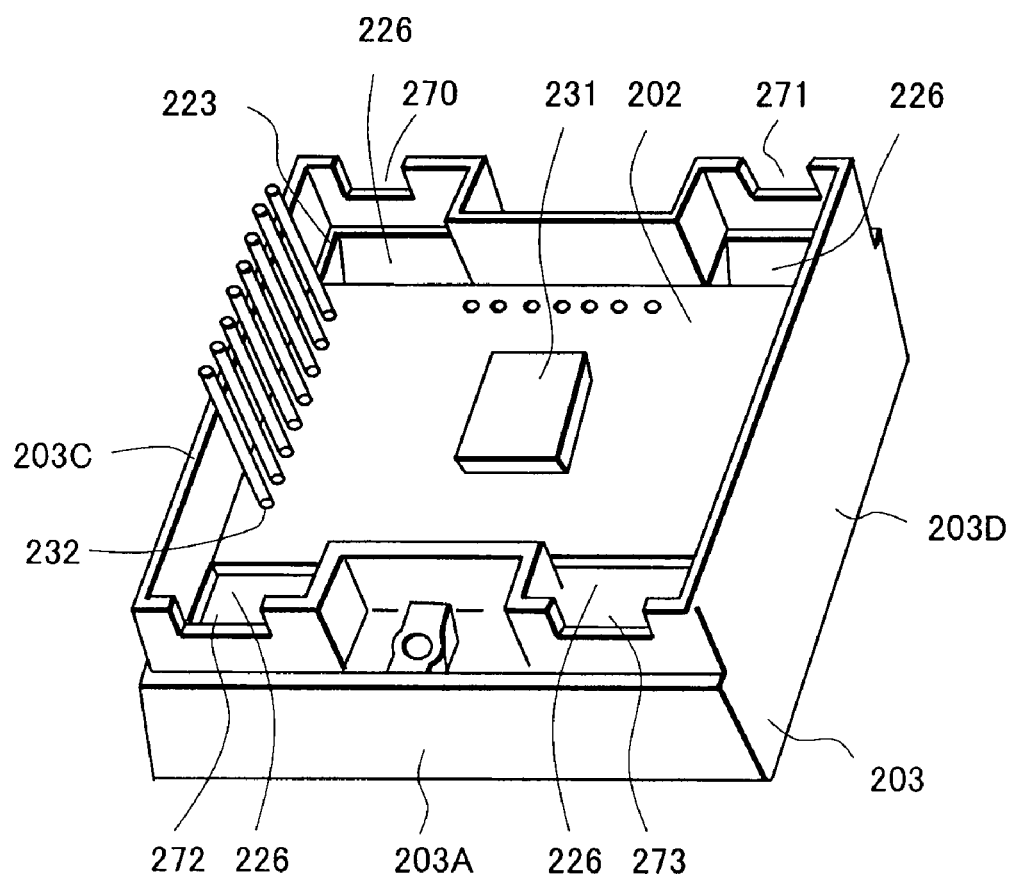
FIG. 9 is a perspective view showing the circuit module which is an embodiment of the circuit device of the present invention.

FIG. 9 is a perspective view of this circuit module, and is separately illustrated in order to clarify a relationship between the case member 203 and the second substrate 202.

Figure 10:
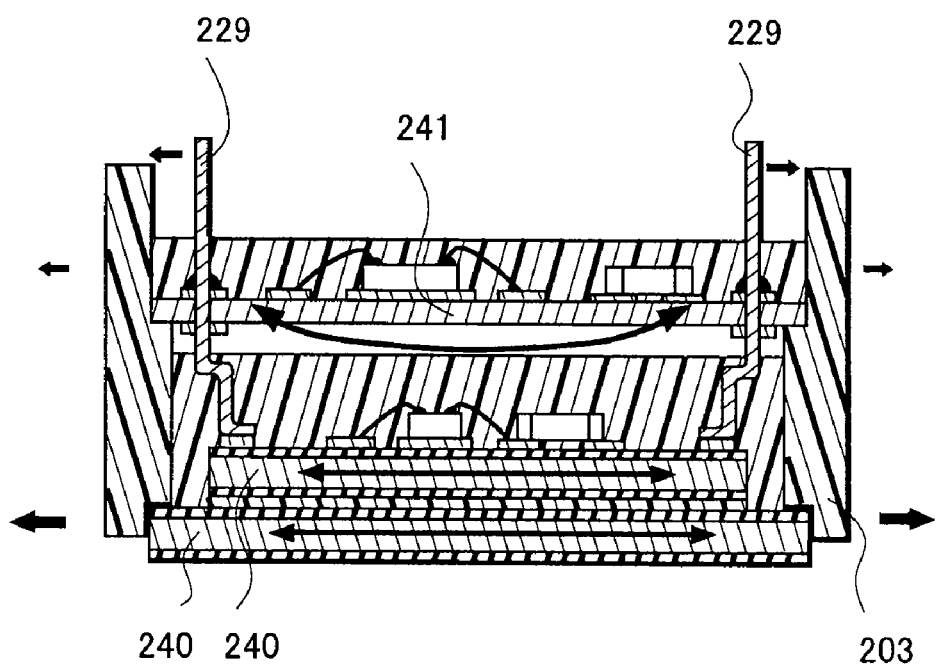
FIG. 10 is a cross sectional view showing the circuit module which is an embodiment of the circuit device of the present invention.

FIG. 10 illustrates a thermal relationship among the resinous case member 203, a first module substrate 240, a second module substrate 241, and an external lead 229. This circuit module achieves an inverter circuit for an air conditioner, as an example, and is mounted to an outdoor unit 250 shown in FIG. 11, for example.

Figure 11:
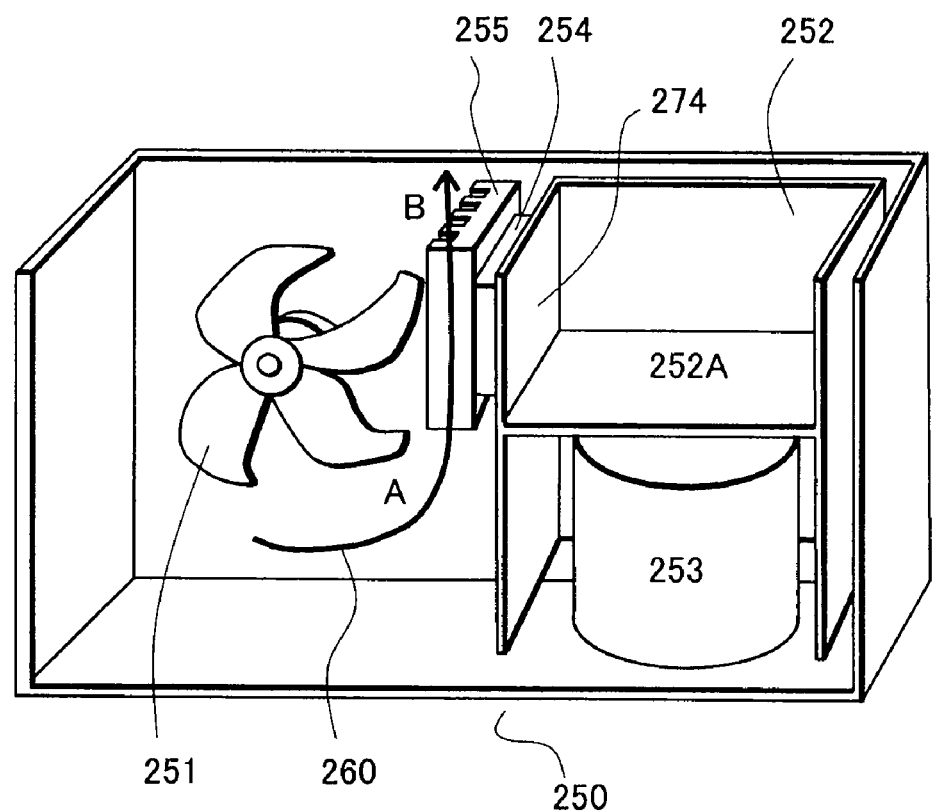
FIG. 11 is a cross sectional view showing an outdoor unit which is an embodiment of the circuit device of the present invention.

FIG. 11 shows the exploded outdoor unit 250, in which reference numeral 251 denotes an air circulation fan, and a heat exchanger is provided behind the fan 251. A frame 252 made of Al or Fe is installed on the right of the fan 251, a compressor 253 is installed under an inner plate 252A, and a printed circuit board on which circuit components are mounted and the like are attached onto the inner plate 252A. Complicated circuit components are provided actually, but the illustration thereof is omitted. In addition, on the left of the inner plate 252A, a printed circuit board is provided being perpendicular to the inner plate 252A and being extended vertically, and a circuit module 254 of the present invention is mounted on this printed circuit board. A heat release fin 255 is mounted on the rear surface of the base substrate 201B, which is the rear surface of this circuit module. In this outdoor unit, the compressor 253, the fan motor, and the circuit components serve as a heat source, and moreover, the main body of the outdoor unit itself is installed outside. Accordingly, the inside of the outdoor unit can be hot. Because of this configuration, the circuit module 54 itself is exposed to high temperature as well.

Here, the coefficient of linear expansion of each of the materials constituting the module is described. The coefficient of linear expansion of Al is $23 \times 10^{-6}/°C$., $(20 \times 10^{-6}/°C$. for Cu), and as for the resin substrate, $\alpha 1$ in the x—y direction is 11 to $12 \times 10^{-6}/°C$., and $\alpha 1$ in the z direction is 25 to $30 \times 10^{-6}/°C$., as an example, and moreover, $\alpha$ of Si is 2.0 to $4.0 \times 10^{-6}/°C$. The coefficient of linear expansion of each of the materials differs from others significantly as described above.

In other words, when the outdoor unit is hot, as shown in FIG. 10, the lower part of the case member 203 expands significantly due to $\alpha$ of the two Al substrates, and in contrast, the printed circuit board side does not expand so much. Then, the case member 203 deforms into a trapezoid-like shape when thus expanded. Accordingly, the printed circuit board 241 bends in the form of a downwardly convex shape. This bend implies that the intersection between the center lines of FIG. 8B is the top of the warp.

Accordingly, the arrangement of circuit elements need to be shifted to be away from the center portion of the second substrate 202, or of the second module substrate 241 in FIG. 10. In other words, shifting the arrangement of the circuit elements to be away from the center portion can improve the reliability of the electric connection of the solder material, the metal thin wire, and the like.

The microcomputers 231, which is the driver element, has especially a greater number of terminals provided therein than other semiconductor elements, so that the reliability thereof can be improved by shifting the microcomputer 231 away from the center portion.

Next, a further heat release path is described using FIG. 9, and FIG. 11 to FIG. 13. Reference numeral 260 in FIG. 11 shows an air flow path A, B that is caused by the air moved upward by being warmed by heat or being moved by the fan 251. As a matter of course, the groove of the heat release fin 255 is provided in a vertical direction. Accordingly, if a cutout portion is provided along the air flow path A to B also in the circuit module 254, the heat release property is improved further.

Figure 12:
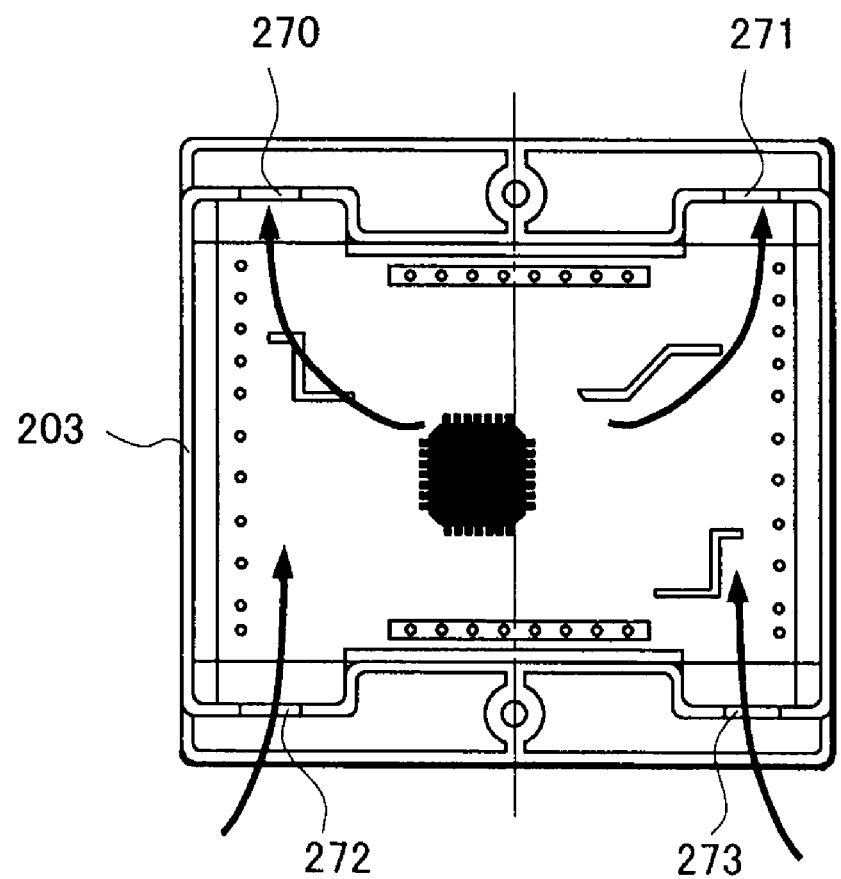
FIG. 12 is a plan view showing a circuit module which is an embodiment of the circuit device of the present invention.
Figure 13:
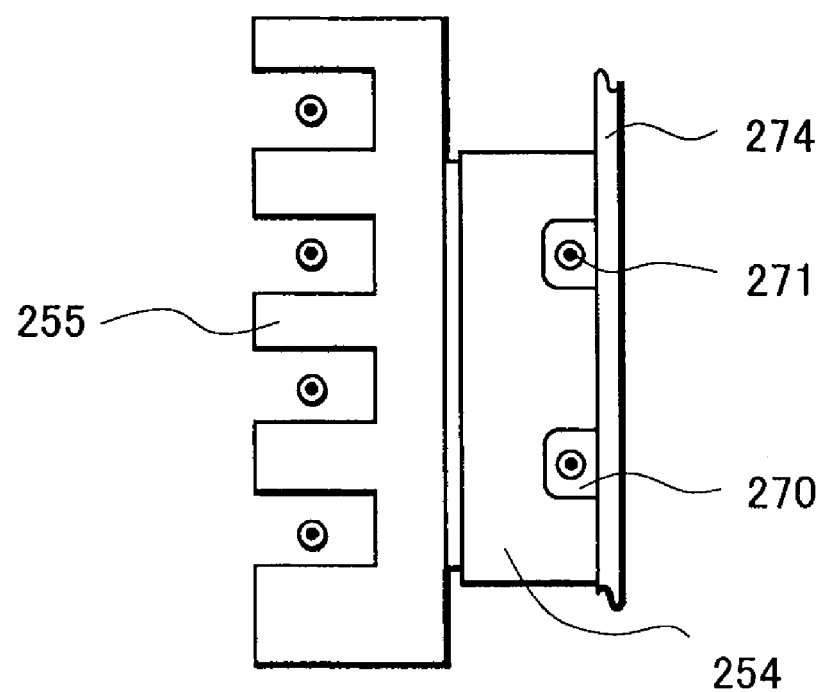
FIG. 13 is a cross sectional view showing the circuit module which is an embodiment of the circuit device of the present invention.

This cutout portion is denoted by reference numerals 270-273 in FIG. 9, and this portion is illustrated also in FIG. 12 and FIG. 13. The front side of FIG. 12 faces the printed circuit board 274 in FIG. 11, and FIG. 13 is a schematic view of the circuit module 254 of FIG. 11 when viewed from above. A circle with black dot illustrated in the cutout portions 270, 271 and in the grooves indicates the direction from the reverse side toward the front side of the figure, i.e., the direction of the air flow path A to B of FIG. 11.

To sum up the above description, the space under the second substrate 202 of FIG. 8A stores the heat of the base substrate, and this heat flows into the space surrounded by the case member 203 and the sealing resin of the second substrate 202, through the spaced portion 226 of FIG. 8B. This movement generates the flow of air flow path A to B of FIG. 11, that is, an air flow path flowing air upwardly in this space. Accordingly, highly efficient heat release can be achieved.

Fourth Embodiment

Figure 14A:
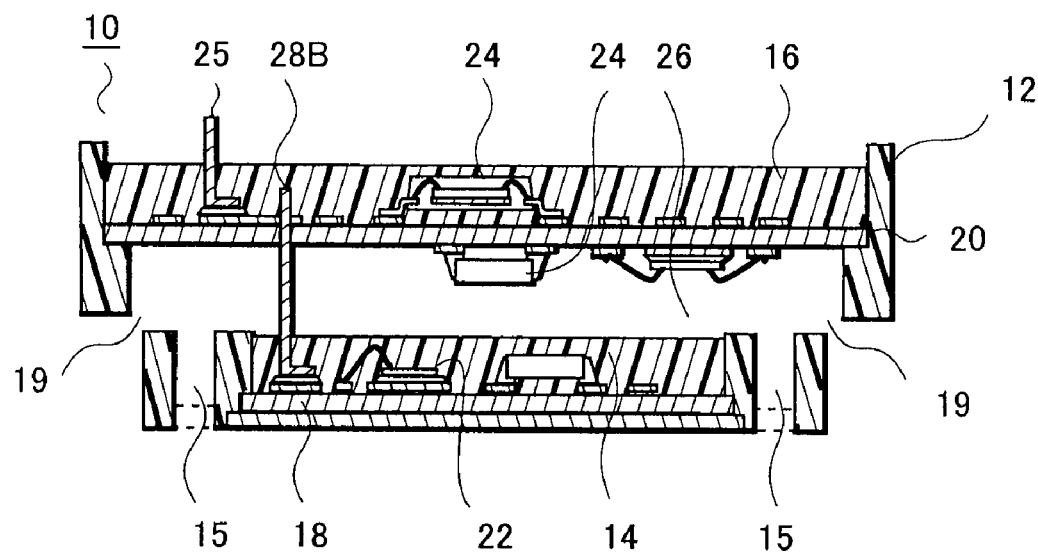
FIG. 14A and FIG. 14B are views showing a hybrid integrated circuit device which is an embodiment of the circuit device of the present invention.
Figure 14B:
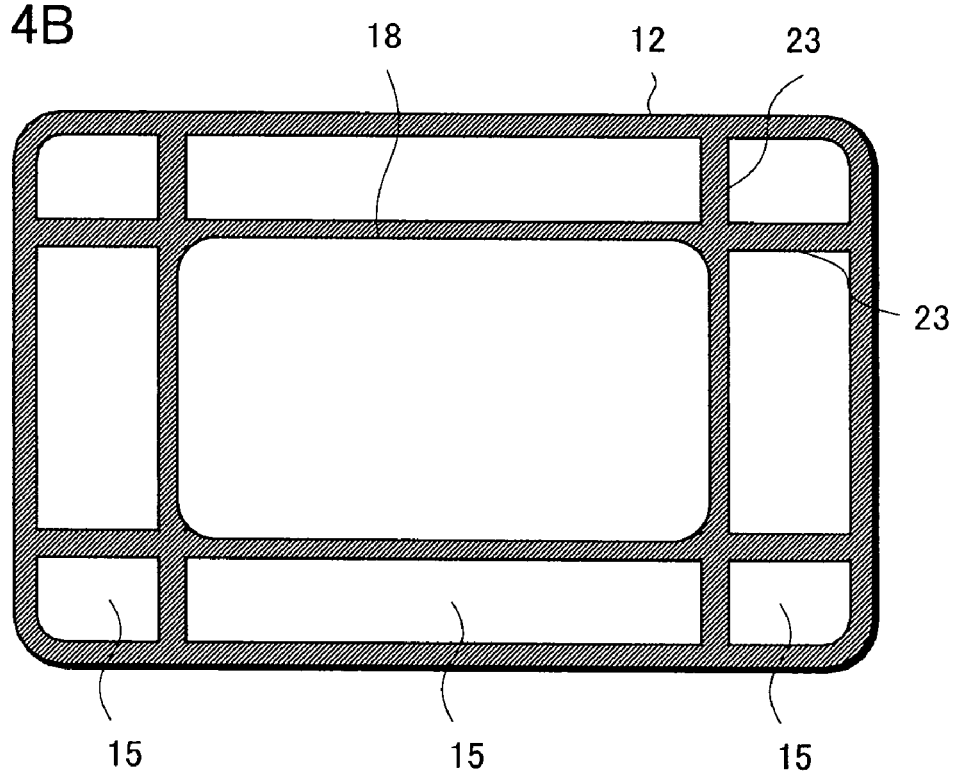
Figure 15:
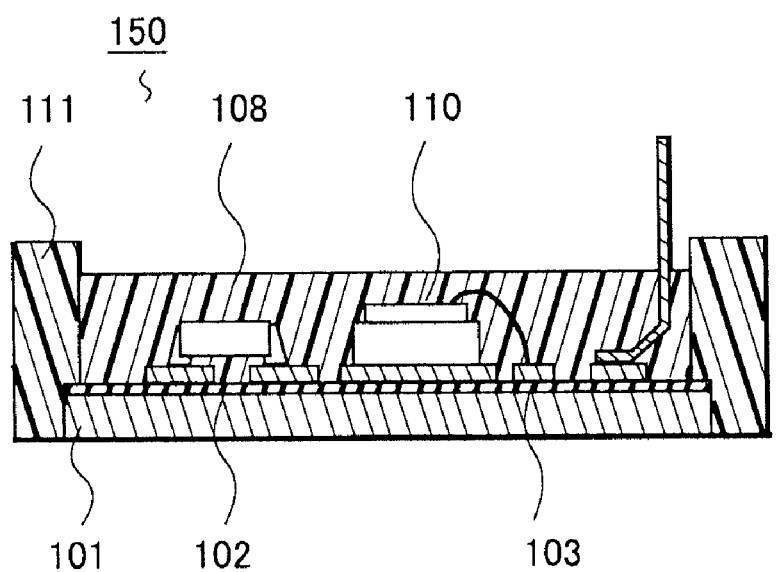
FIG. 15 is a cross sectional view showing a hybrid integrated circuit device described in the background of the invention.

In this embodiment, the configuration of another form of the hybrid integrated circuit device 10 is described with reference to FIG. 14A and FIG. 14B. FIG. 14A is a cross sectional view of the hybrid integrated circuit device 10, and FIG. 14B is a plan view of the hybrid integrated circuit device 10 when viewed from below. The basic configuration of this embodiment is the same as that of the first embodiment, and the difference therebetween lies in that the communicating openings 15, 19 are provided in the lower face as well as the side face of the case member.

As shown in FIG. 14A, the first circuit board 18 on which a power transistor is arranged is formed smaller than the second circuit board 20 on which controlling elements, such as a microcomputer, are arranged. Since the case member 12 has such a size large enough to house a larger second circuit board 20, a space is produced in the periphery of the first circuit board 18 when the first circuit board 18 is arranged in the center portion of the case member 12. Here, the communicating opening 15 is provided in the bottom of the case member 12 in the periphery of the first circuit board 18. With this configuration, the air having high temperature in the hollow portion 26 inside the device is released to the outside through the communicating opening 15. At the same time, the unheated air is admitted into the hollow portion 26 through the communicating opening 15. In addition, a communicating opening 19 is provided by partially opening the side wall part of the case member 12, and this communicating opening 19 has the same function as that of the communicating opening 15.

As shown in FIG. 14B, a supporting part 23 in a frame form is provided in the case member 12 to support the first circuit board 18 near the center portion of the case member 12. The communicating openings 15 are provided on the rear surface of the case member 12, in the periphery of the first circuit board 18.

In addition, as shown in FIG. 14A, an output signal from the switching circuit formed on the upper face of the first circuit element 22 may be outputted to the outside via the both of a lead fixedly secured to the upper face of the first circuit board 18 and a lead fixedly secured to the second circuit board 20. In addition, a high current of the source power or the like may be inputted to the inside of the device via the both of the leads. Specifically, a lead 28B is fixedly secured to the upper face of the first circuit board 18, and the lead 28B is connected to the first circuit element 22 constituting the switching circuit. The upper end of the lead 28B extends penetrating the second circuit board 20 and is connected to a conductive pattern formed on the upper face of the second circuit board 20. Additionally, the upper end part of the lead 28B is not led to the outside.

A lead 25 that is formed thicker than the lead 28B is fixedly secured to the upper face of the second circuit board 20, and the lead 25 is connected to the lead 28B via the conductive pattern formed on the upper face of the second circuit board 20. This configuration allows an output from the first circuit element 22 to be taken out to the outside via the lead 28B and the lead 25, the first circuit element 22 being arranged on the upper face of the first circuit board 18.

Additionally, a small signal, such as a control signal or an input to a sensor, may be inputted and outputted through a plug-in type connector mounted on the upper face of the second circuit board 20.

In the present invention, the first circuit board and the second circuit board are provided inside the case member, and the communicating opening for allowing the internal space of the case member and the outside to communicate with each other is provided in the case member. This configuration causes the air being inside the case member to be easily released to the outside through the communicating opening. Accordingly the first circuit element fixedly secured to the first circuit board and the second circuit element fixedly secured to the second circuit board are thermally insulated from each other. In other words, even when the air housed in the internal space of the case member is heated, for example, by a large amount of heat being generated in the first circuit element, which is a power transistor, the heated air is released to the outside from the communicating opening provided in the case member. Accordingly, for example, the second circuit element, which is a microcomputer having a low operating temperature, can be prevented from being heated by the conduction of the heat generated in the first circuit element.

In addition, in the present invention, since the cutout portion along the air flow path is provided in the case member of the circuit module, the heat generated in the circuit module can be frequently released to the outside even when the circuit module is installed in an outdoor unit.

What is claimed is:

1. A circuit device, comprising:
   a case member;
   a first circuit board and a second circuit board incorporated into the case member and arranged in a way that the first circuit board is overlaid with the second circuit board;
   a first circuit element fixedly secured to a principal face of the first circuit board;
   a second circuit element fixedly secured to a principal face of the second circuit board, the first and second circuit boards being disposed so that the first circuit element faces the second circuit element; and
   a first sealing resin sealing the principal face of the first circuit board and a second sealing resin sealing the principal face of the second circuit board,
   wherein the first and second sealing resins define a hollow portion between them, and
   a communicating opening for allowing the hollow portion to communicate with an outside is provided in the case member.

2. The circuit device according to claim 1, wherein the first circuit board comprises a metal.

3. A circuit device, comprising:
   a case member;
   a first circuit board and a second circuit board incorporated into the case member and arranged in a way that the first circuit board is overlaid with the second circuit board;
   a first circuit element, which is a power transistor, fixedly secured to a principal face of the first circuit board;
   a second circuit element which is fixedly secured to a principal face of the second circuit board and controls an operation of the first circuit element, the first and second circuit boards being disposed so that the first circuit element faces the second circuit element;
   a third circuit element fixedly secured to another face of the second circuit board opposite from the principal face of the second circuit board;
   a first sealing resin sealing the first circuit element and the principal face of the first circuit board; and
   a second sealing resin sealing the second circuit element and the principal face of the second circuit board,
   wherein the first and second sealing resins define a hollow portion between them, and
   a communicating opening for allowing the hollow portion to communicate with an outside is provided in the case member.

4. The circuit device according to claim 3, wherein the communicating opening is provided by partially opening a side wall part of the case member.

5. The circuit device according to claim 4, wherein the case member comprises two side walls facing each other, and the communicating opening is provided in one of the two side walls and another communicating opening is provided in the other of the two side walls.

6. The circuit device according to claim 3, wherein a maximum operating temperature of the second circuit element is lower than a maximum operating temperature of the first circuit element.

7. The circuit device according to claim 3, wherein the first circuit board comprises a first metal substrate, a surface of which is exposed to the outside of the case member, a second metal substrate disposed on the first metal substrate and an insulation layer disposed between the first and second metal substrates, wherein an edge of the second metal substrate recedes from an edge of the first metal substrate, the first circuit element is disposed on a top surface of the second metal substrate, and a conducting pattern is disposed on the top surface of the metal substrate so that the conducting pattern is electrically connected to the second metal substrate.

8. The circuit device according to claim 3, further comprising a lead that penetrates the second circuit board and contacts a pad formed on a first circuit board so that the first and second circuit elements are electrically connected.

9. The circuit device according to claim 3, wherein the first circuit board comprises a metal.

* * * * *